(12) United States Patent
Hayashi et al.

(10) Patent No.: US 9,404,196 B2
(45) Date of Patent: Aug. 2, 2016

(54) MANUFACTURING METHOD OF GROUP 13 NITRIDE CRYSTAL

(75) Inventors: Masahiro Hayashi, Miyagi (JP); Seiji Sarayama, Miyagi (JP); Takashi Satoh, Miyagi (JP); Hiroshi Nambu, Kanagawa (JP); Chiharu Kimura, Miyagi (JP); Naoya Miyoshi, Miyagi (JP)

(73) Assignee: RICOH COMPANY, LTD., Tokyo (JP)

( * ) Notice: Subject to any disclaimer, the term of this patent is extended or adjusted under 35 U.S.C. 154(b) by 868 days.

(21) Appl. No.: 13/592,555

(22) Filed: Aug. 23, 2012

(65) Prior Publication Data

US 2013/0061799 A1    Mar. 14, 2013

(30) Foreign Application Priority Data

Sep. 14, 2011    (JP) ................. 2011-201206

(51) Int. Cl.
*C30B 9/10* (2006.01)
*C30B 9/12* (2006.01)
*C30B 29/40* (2006.01)

(52) U.S. Cl.
CPC ... *C30B 9/12* (2013.01); *C30B 9/10* (2013.01); *C30B 29/406* (2013.01)

(58) Field of Classification Search
CPC ...... C30B 29/406; C30B 29/403; C30B 9/10; C30B 9/00
USPC .............................. 117/73, 75, 902, 921, 952
See application file for complete search history.

(56) References Cited

U.S. PATENT DOCUMENTS

| | | |
|---|---|---|
| 2003/0164138 A1 | 9/2003 | Sarayama et al. |
| 2004/0134413 A1 | 7/2004 | Iwata et al. |
| 2004/0226503 A1 * | 11/2004 | Iwata et al. ........ 117/2 |
| 2006/0006395 A1 | 1/2006 | Kobayashi et al. |
| 2007/0034143 A1 | 2/2007 | Sarayama et al. |
| 2007/0084399 A1 | 4/2007 | Sarayama et al. |
| 2007/0128746 A1 | 6/2007 | Iwata et al. |
| 2007/0169689 A1 | 7/2007 | Kobayashi et al. |
| 2007/0194408 A1 | 8/2007 | Iwata et al. |

(Continued)

FOREIGN PATENT DOCUMENTS

| | | |
|---|---|---|
| JP | 2006-045047 | 2/2006 |
| JP | 2007-277074 | 10/2007 |

(Continued)

OTHER PUBLICATIONS

Eurpoean Patent Office, English computer translation of JP 2008-094704 (2015).*

(Continued)

*Primary Examiner* — Matthew Song
(74) *Attorney, Agent, or Firm* — Cooper & Dunham LLP

(57) ABSTRACT

A method of manufacturing a group 13 nitride crystal includes a crystal growth process to form the group 13 nitride crystal by growing the group 13 nitride crystal having a hexagonal crystal structure from a seed crystal which is a gallium nitride crystal having a hexagonal crystal structure in which a length "L" in a c-axis direction is 9.7 mm or more, and a ratio L/d of the length "L" to a crystal diameter "d" in a c-plane is larger than 0.813. The crystal growth process includes a process of forming an outer periphery containing a {10-10} plane and an outer periphery containing a {10-11} plane at side surfaces of the group 13 nitride crystal, and forming an outer periphery containing a {0001} plane at a bottom surface of the group 13 nitride crystal.

8 Claims, 18 Drawing Sheets

(56) References Cited

U.S. PATENT DOCUMENTS

| | | |
|---|---|---|
| 2007/0215034 A1 | 9/2007 | Iwata et al. |
| 2007/0266928 A1 | 11/2007 | Iwata et al. |
| 2008/0081015 A1 | 4/2008 | Sarayama et al. |
| 2008/0216737 A1 | 9/2008 | Sarayama et al. |
| 2008/0220346 A1 | 9/2008 | Sarayama et al. |
| 2008/0264331 A1 | 10/2008 | Iwata et al. |
| 2009/0249997 A1 | 10/2009 | Sarayama et al. |
| 2010/0075107 A1* | 3/2010 | Saito et al. ............... 428/141 |
| 2010/0104495 A1 | 4/2010 | Kawabata et al. |
| 2010/0229787 A1 | 9/2010 | Sarayama et al. |
| 2011/0012235 A1 | 1/2011 | Iwata et al. |
| 2011/0253034 A1 | 10/2011 | Iwata et al. |
| 2012/0003446 A1 | 1/2012 | Satoh et al. |
| 2012/0085279 A1 | 4/2012 | Sarayama et al. |

FOREIGN PATENT DOCUMENTS

| | | | |
|---|---|---|---|
| JP | 2008-094704 | | 4/2008 |
| JP | 2008094704 A | * | 4/2008 |
| JP | 2008-120672 | | 5/2008 |
| JP | 2009-126771 | | 6/2009 |
| JP | 2011-213579 | | 10/2011 |
| WO | WO2010/017232 | | 2/2010 |
| WO | WO2011/044554 | | 4/2011 |

OTHER PUBLICATIONS

Chinese official action dated Nov. 3, 2014 (and English translation thereof) in connection with corresponding Chinese patent application No. 2012 10 33 6715.5.

Iwahashi, Tomoya et al., "Liquid Phase Epitaxy Growth of m-Plane GaN Substrate Using the Na Flux Method", Japanese Journal of Applied Physics, vol. 46, No. 10, 2007, p. L227-L229.

European Search Report dated Apr. 1, 2014 in connection with corresponding European patent application No. 12 18 1565.8.

Masato Aoki et al., "Conditions for seeded growth of GaN crystals by the Na flux method", Materials Letters, vol. 56, Nov. 1, 2002, p. 660-664.

Korean Notice of Allowance dated Jul. 9, 2014 and English translation thereof in connection with corresponding Korean patent application No. 10-2012-0096215.

Oct. 18, 2013 Korean official action in connection with corresponding Korean patent application No. 10-2012-0096215.

Hisanori Yamane et al., "Morphology and characterization of GaN single crystals grown in a Na flux", J Crystal Growth, 1998, pp. 8-12, vol. 186.

Hisanori Yamane, et al., "Preparation of GaN Single Crystals Using a Na Flux," Chemistry of Materials, vol. 9 (1997), pp. 413-416.

* cited by examiner

CROSS SECTION A-A

CROSS SECTION A-A

CROSS SECTION A-A

MANUFACTURING METHOD OF GROUP 13 NITRIDE CRYSTAL

CROSS-REFERENCE TO RELATED APPLICATIONS

The present application claims priority to and incorporates by reference the entire contents of Japanese Patent Application No. 2011-201206 filed in Japan on Sep. 19, 2011.

BACKGROUND OF THE INVENTION

1. Field of the Invention

The present invention relates to a manufacturing method of group 13 nitride crystal.

2. Description of the Related Art

Semiconductor materials based on gallium nitride (GaN) are used for blue color LED (light-emitting diode) or white color LED, and a semiconductor device such as semiconductor laser (also called "LD: Laser Diode"). The white color LED is used for illumination purpose or back lighting of cell phones, LC (Liquid Crystal) display or the like. The blue color LED is used for traffic lights or other illumination purpose and so on. On the other hand, blue-violet semiconductor laser is used as light sources of Blu-ray discs. Presently, most of semiconductor devices based on GaN used as light sources of UV or violet-blue-green color are fabricated by using MO-CVD (Metalorganic Chemical Vapor Deposition) method or MBE (Molecular Beam Epitaxy) method to grow crystal on sapphire or SiC substrate.

There are problems in a case that sapphire or SiC is used as substrate. Crystal defects increases because of the significant difference of thermal expansion coefficient or lattice constant between the substrate and the group 13 nitride. Such a defect affects device properties. For example, it becomes harder to elongate the lifetime of emitting device. And, the operating power may increase. In order to address these problems, it is the most preferable way to use a gallium nitride substrate which is made of the same material as crystal to be grown on the substrate.

Presently, free-standing GaN substrates are manufactured in such a manner that a thick gallium nitride crystal is grown on a hetero-substrate such as sapphire substrate or GaAs substrate by HVPE (Hydride Vapor Phase Epitaxy) with employing ELO (Epitaxial Lateral Overgrowth) which is a method to reduce the dislocation density, and then the thick film of gallium nitride is separated from the hetero-substrate. The gallium nitride substrate manufactured as such has a dislocation density reduced to the order of $10^6$ cm$^{-2}$, and allows a size up to 2 inches in practical use mainly for laser device purpose. Recently, there is a further need for much larger diameter of substrate up to 4 inches or 6 inches for electronic devices, or cost saving of white color LEDs.

Warpage or cracks which may be induced by the difference of the thermal expansion coefficient or the lattice constant between the hetero-substrate and the gallium nitride hinders to enlarge the diameter of substrate. The aforementioned dislocation density still remains. There is also a problem of high manufacturing cost in processes of separating one thick film of gallium nitride from one hetero-substrate, and polishing it to form the gallium nitride substrate.

On the other hand, as one of liquid phase methods to realize the gallium nitride substrate, many efforts have been made for developing the flux method in which the gallium nitride crystal is formed by dissolving the nitrogen from a gaseous phase into a molten mixture of group 13 metal and alkali metal.

In the flux method, a molten mixture containing the alkali metal such as sodium (Na) and potassium (K) and the group 13 metal such as gallium (Ga) is heated to about 600 to 900 degrees Celsius under an atmosphere where the nitrogen pressure is 10 MPa or less. Thus, the nitrogen is dissolved from the gaseous phase and reacts with the group 13 metal in the molten mixture to form the group 13 nitride crystal. The flux method allows a crystal growth with a lower temperature and lower pressure in comparison with other liquid phase methods. The crystal formed by the flux method has a low dislocation density advantageously lower than $10^6$ cm$^{-2}$.

There is a report that gallium nitride crystal is formed under conditions that sodium azide (NaN$_3$) and metal Ga which are used as source materials are put and sealed in a reactor vessel made of stainless steel (as for sizes inside of the vessel, inner diameter is 7.5 mm, length is 100 mm) under a nitrogen atmosphere, and the reactor vessel is retained at 600 to 800 degrees Celsius for 24 to 100 hours (Chemistry of Materials Vol. 9 (1997) 413-416).

Japanese Patent Application Laid-open No. 2008-94704 discloses a method of manufacturing a column-like crystal of gallium nitride by using a needle-like crystal of aluminum nitride (AlN) as seed crystal in order to provide a large crystal of gallium nitride. Japanese Patent Application Laid-open No. 2006-045047 discloses a method of manufacturing a needle-like crystal of aluminum nitride which becomes a seed crystal. Japanese Patent Application Laid-open No. 2009-126771 discloses a seed crystal of which a yellow emission effect is observed, and a gallium nitride crystal which is formed on the seed crystal and has a crystal layer of which a yellow emission effect is not observed.

In a case that gallium nitride crystal is formed from aluminum nitride as seed crystal, however, the difference of lattice constant between aluminum nitride and gallium nitride may arise dislocations due to the lattice mismatch. Since thermal expansion coefficient is also different between aluminum nitride and gallium nitride, thermal stress may arise new dislocations or even cracks, in the course of cooling from a crystal growth temperature to a room temperature.

Therefore, it is preferable to use gallium nitride crystal as seed crystal which has the same lattice constant or the same thermal expansion coefficient with the target crystal, in order to grow a high quality gallium nitride crystal with low dislocation density. However, it is difficult to grow a needle-like crystal of gallium nitride by the method disclosed in Japanese Patent Application Laid-open No. 2006-045047. Therefore, it is difficult to obtain a high quality bulk crystal by any conventional method.

SUMMARY OF THE INVENTION

It is an object of the present invention to at least partially solve the problems in the conventional technology.

A method of manufacturing a group 13 nitride crystal includes a crystal growth process to form the group 13 nitride crystal by growing the group 13 nitride crystal having a hexagonal crystal structure from a seed crystal which is a gallium nitride crystal having a hexagonal crystal structure in which a length "L" in a c-axis direction is 9.7 mm or more, and a ratio L/d of the length "L" to a crystal diameter "d" in a c-plane is larger than 0.813. The crystal growth process includes a process of forming an outer periphery containing a {10-10} plane and an outer periphery containing a {10-11} plane at side surfaces of the group 13 nitride crystal, and forming an outer periphery containing a {0001} plane at a bottom surface of the group 13 nitride crystal.

A method of manufacturing a group 13 nitride crystal includes a crystal growth process to form the group 13 nitride crystal by growing the group 13 nitride crystal having a hexagonal crystal structure from a seed crystal which is a gallium nitride crystal having a hexagonal crystal structure in which a length "L" in a c-axis direction is 9.7 mm or more, and a ratio L/d of the length "L" to a crystal diameter "d" in a c-plane is larger than 0.813. The crystal growth process includes a process of forming outer peripheries containing a {0001} plane at a top surface and a bottom surface of the group 13 nitride crystal, and forming an outer periphery containing a {10-10} plane and an outer periphery containing a {10-11} plane at side surfaces of the group 13 nitride crystal.

DETAILED DESCRIPTION OF THE PREFERRED EMBODIMENTS

Figure 1:
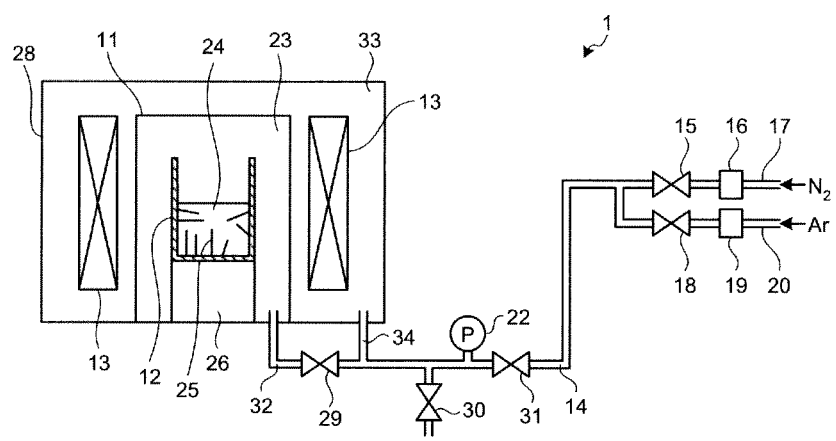
FIG. 1 is a schematic sectional view illustrating a crystal manufacturing apparatus to form a seed crystal in an embodiment.

Now an explanation will be made on a manufacturing method of group 13 nitride crystal according to an embodiment, with reference to the accompanying drawings. The accompanying drawings herein only schematically show shapes, sizes and arrangements of constituents, elements or components to an extent necessary for a clear understanding of the present invention. However, these drawings shall not be considered any limitation to the present invention. Identical reference numerals are given to the same or corresponding constituents, elements or components among the plurality of drawings, while the redundant explanation may be omitted as appropriate.

[1] Crystal Growth Process of Seed Crystal

<Crystal Manufacturing Apparatus>

FIG. 1 schematically shows a crystal manufacturing apparatus 1 to produce a seed crystal 25 according to an embodiment. The crystal manufacturing apparatus has a double structure in which an inner vessel 11 is disposed in an outside pressure resistant vessel 28 made of stainless material, and a reactor vessel 12 is disposed in the inner vessel 11. The inner vessel 11 is attachable to and detachable from the outside pressure resistant vessel 28.

The reactor vessel 12 is for maintaining a molten mixture 24 obtained by melting source material(s) or additive(s) in order to obtain the seed crystal 25. The configuration of the reactor vessel 12 will be described later.

To the outside pressure resistant vessel 28 and the inner vessel 11, gas pipes 34 and 32 are respectively connected to supply nitrogen ($N_2$) gas which is source material of the group 13 nitride crystal and a diluent gas for controlling a whole pressure to an inner space 33 of the outside vessel 28 and an inner space 23 of the inner vessel 11. A gas supplying pipe 14 is branched into a nitrogen supplying pipe 17 and a diluent gas supplying pipe 20 via valves 15 and 18, respectively. These pipes 17 and 20 can be separated at valves 15 and 18, respectively.

Argon (Ar) gas which is inert gas is preferably used as the diluent gas. However, the embodiment is not limited to this. For example, other inert gas such as helium (He) may be used as the diluent gas.

The nitrogen gas is introduced from the nitrogen supplying pipe 17 which is connected to a gas canister or the like containing the nitrogen gas therein. The nitrogen gas from the pipe 17 is subjected to a pressure control by a pressure regulator 16 and then supplied to the gas supplying pipe 14 via the valve 15. On the other hand, the diluent gas (e.g. Ar gas) is introduced from the diluent gas supplying pipe 20 which is connected to a gas canister or the like containing the diluent gas therein. The diluent gas from the pipe 20 is subjected to a pressure control by a pressure regulator 19 and then supplied to the gas supplying pipe 14 via the valve 18. Thus, the pressure regulated nitrogen gas and the pressure regulated diluent gas are supplied to the gas pipe 14 to be mixed there.

The gas mixture of the nitrogen gas and the diluent gas is supplied to the outside vessel 28 and the inner vessel 11 from the pipe 14 via the valves 31 and 29. The inner vessel 11 can be removed from the apparatus 1 at the valve 29.

A pressure meter 22 is disposed on the pipe 14 for monitoring a whole pressure inside of the outside vessel 28 and the inner vessel 11 and controlling pressures inside of the outside vessel 28 and inner vessel 11.

In the embodiment, nitrogen partial pressure can be controlled by controlling the pressures of the nitrogen gas and the diluent gas by means of valves 15 and 18 and the pressure regulators 16 and 19. Since the whole pressure of the outside vessel 28 and the inner vessel 11 can be also controlled, it is possible to reduce evaporation of alkali metal (e.g. sodium) in the reactor vessel 12 by increasing the whole pressure of the inner vessel 11. In other words, it is possible to control separately the nitrogen partial pressure which becomes a nitrogen source affecting the crystal growth conditions of GaN and the whole pressure which affects the reduction of sodium evaporation.

As shown in FIG. 1, a heater 13 is disposed around the outer circumference of the inner vessel 11 inside of the outside vessel 28 for heating the inner vessel 11 and the reactor vessel 12 and controlling the temperature of the molten mixture 24.

<Manufacturing Method of Crystal>

The manufacturing method according to the embodiment is a method of producing a seed crystal 25 of gallium nitride by the flux method. Incidentally, the seed crystal 25 may be simply referred to as gallium nitride crystal 25.

The manufacturing method of crystal according to the embodiment includes the first process to grow the first region of gallium nitride crystal containing boron, and the second process to grow, outside of the first region, the second region of gallium nitride crystal having the boron density lower than that of the first region.

In order to grow the crystal with different boron densities between the inner side and the outer side of the gallium nitride crystal 25, the manufacturing method of crystal according to the embodiment includes a boron melting process to melt the boron into the molten mixture 24, a boron taking process to take the boron into the crystal during the growth of the gallium nitride crystal 25, and a boron reducing process to reduce the boron density in the molten mixture 24 in the course of the crystal growth.

In the boron melting process, the boron is melted into the molten mixture 24 from boron nitride (BN) contained in the inner wall of the reactor vessel 12 or from a boron nitride component disposed inside of the reactor vessel 12. Then, a small amount of the melted boron is taken into the crystal while the gallium nitride crystal 25 grows (the boron taking process). An amount of boron taken into the gallium nitride crystal 25 is gradually reduced as the crystal grows (the boron reducing process).

Due to the boron reducing process, it is possible to reduce the boron density of the outer region in a cross section intersecting the c-axis in comparison with the boron density of the inner region in the cross section, while the gallium nitride crystal 25 grows with growing the m-planes ({10-10} planes). Thereby, the density of boron as an impurity can be reduced and the dislocation density which may be induced by the impurities can be reduced, at the outer circumference surface comprised of the m-planes (six side surfaces of the hexagonal column) of the gallium nitride crystal 25. Thus, the outer circumference of the gallium nitride crystal 25 can be made of the higher quality crystal in comparison with the inner region.

In a manufacturing method as described in the following [3] to grow the group 13 nitride crystal 27 from the seed crystal 25 to form the group 13 nitride crystal 80, the group 13 nitride crystal 27 is grown mainly from side surfaces of the seed crystal 25 (the outer circumference surface comprised of m-planes) as start points of the crystal growth. Thereby, if the outer circumference surface comprised of m-planes of the seed crystal 25 is of a good quality as described above, the crystal 27 grown from the surface becomes of a good quality. Therefore, according to the embodiment, it is possible to grow a large and high quality seed crystal 25 and thereby a high quality group 13 nitride crystal 27.

Next, a further detail explanation will be made on the boron melting process, the boron taking process and the boron reducing process.

(1) Method that Reactor Vessel 12 Contains Boron Nitride

In an example of the boron melting process, a reactor vessel 12 made of a sintered BN (sintered boron nitride) can be used as the reactor vessel 12. In the course of heating the reactor vessel 12 to a crystal growth temperature, boron is melted from the reactor vessel 12 into the molten mixture 24 (the boron melting process). Then, the boron in the molten mixture 24 is taken into the seed crystal 25 in the course of growing the seed crystal 25 (the boron taking process). The boron in the molten mixture is gradually reduced as the seed crystal 25 grows (the boron reducing process).

In the aforementioned example, the reactor vessel 12 made of the sintered BN is used. However, the reactor vessel 12 is not limited to this. In a preferred embodiment, it is sufficient that the reactor vessel 12 includes a BN-contained material (e.g. sintered BN) at a part at least of its inner wall contacting the molten mixture 24. The other part of the reactor vessel 12 may be made of nitride such as pyrolytic BN (P-BN) and the like, oxide such as alumina, YAG and the like, carbide such as SIC and the like.

(2) Method that BN-Contained Material is Placed in the Reactor Vessel 12

In another example of the boron melting process, a BN-contained material may be placed in the reactor vessel 12. For example, a sintered BN may be placed in the reactor vessel 12. Materials for the reactor vessel 12 are not limited to any particular one similarly to the process (1).

In this method, in the course of heating the reactor vessel 12 to a crystal growth temperature, boron is gradually melted from the material placed in the reactor vessel 12 into the molten mixture 24 (the boron melting process).

In the processes (1) and (2), crystal nuclei of GaN crystal 25 are likely to be formed on a surface of the BN-contained material contacting the molten mixture 24. Therefore, if the BN surface (i.e. the inner wall surface or the material surface) is gradually covered with the GaN crystal nuclei formed thereon, the amount of boron melted from the covered BN material into the molten mixture 24 gradually decreases (the boron reducing process). Furthermore, in accordance with the growth of the GaN crystal, a surface area of the crystal gradually increases and thereby the density of boron which is taken into the GaN crystal decreases 25 (the boron reducing process).

In the processes (1) and (2), the boron-contained material is used for melting the boron into the molten mixture 24. A method or process for melting the boron into the molten mixture 24 is not limited to this. For example, boron may be added into the molten mixture 24, or any other process may be used. As for a method or process for reducing the boron density in the molten mixture 24, any other method or process may be used. The crystal manufacturing method according to the embodiment sufficiently includes the boron melting process, the boron taking process and the boron reducing process, as mentioned above at least.

<Preparation of Materials or the Like, and Crystal Growth Conditions>

An operation to put the source material or the like into the reactor vessel 12 is conducted in such a manner that the pressure resistant vessel 11 is put into a glove box under an inert gas atmosphere such as Ar.

In a case that the seed crystal 25 is grown by the method a material used as a flux, and source material(s) are put into the reactor vessel 12 as explained in the method (1).

In a case that the seed crystal 25 is grown by the process (2), a BN-contained material as explained in the method (2), a material used as a flux and source material(s) are put into the reactor vessel 12 as explained in the process (2).

The material used as flux may be sodium, or sodium compound (e.g. sodium azide). Any other material including other alkali metals such as lithium and potassium, or compounds of these alkali metals may be used as the flux. Furthermore, alkali earth metals such as barium, strontium, and magnesium, or compounds of these alkali earth metals may be used as the flux. A plurality kind of alkali metals or alkali earth metals may be used.

As the source material, gallium is used. Any other materials including without limitation other group 13 elements such as boron, aluminum and indium, or mixtures thereof may be used as source material(s) to be put into the reactor vessel 12.

After setting the source material(s) and others as mentioned above, the inner vessel 11 and the reactor vessel 12 inside of the inner vessel 11 are heated to a crystal growth temperature by turning on the heater 13. Then, the source material is melted with the material used as the flux in the reactor vessel 12 to form the molten mixture 24. Nitrogen as the source material of the seed crystal 25 can be supplied to the molten mixture 24 by bring the nitrogen having the aforementioned partial pressure into contact with the molten mixture 24 and thereby dissolving the nitrogen into the molten mixture 24. Furthermore, boron is melted into the molten mixture 24 as described above (the boron melting process and the molten mixture forming process).

Crystal nuclei of gallium nitride crystal 25 are formed on the inner wall of the reactor vessel 12 from source materials melted in the molten mixture 24. The source materials and boron in the molten mixture 24 are supplied to these nuclei to grow the nuclei to the needle-like gallium nitride crystal 25. In the course of the crystal growth of the gallium nitride crystal 25, as described above, boron in the molten mixture 24 is taken into the gallium nitride crystal 25 (the boron taking process), so that the "boron-rich" first region 25a is likely to be formed at the inner side of the gallium nitride crystal 25 (FIG. 2). Then, as the crystal grows, the amount of boron taken into the crystal reduces (the boron reducing process). Thus, the "boron-poor" second region 25b is likely to be formed at the outside of the first region 25a.

Preferably, in the crystal manufacturing method according to the embodiment, the partial pressure of nitrogen in the pressure resistant vessel 11 is 5 MPa to 10 MPa.

Preferably, in the crystal manufacturing method according to the embodiment, the temperature in the molten mixture 24 (the crystal growth temperature) is 800 degrees Celsius to 900 degrees Celsius.

In a preferred embodiment, a mol ratio of alkali metal to the total mol number of gallium and alkali metal (e.g. sodium) is 75% to 90%, the crystal growth temperature of the molten mixture 24 is 860 degrees Celsius to 900 degrees Celsius, and the partial pressure of nitrogen is 5 MPa to 8 MPa.

In a further preferred embodiment, the mol ratio of gallium to alkali metal is 0.25:0.75, the crystal growth temperature is 860 degrees Celsius to 870 degrees Celsius, and the partial pressure of nitrogen is 7 MPa to 8 MPa (see Examples).

[2] Seed Crystal

The gallium nitride crystal according to the embodiment is a seed crystal 25 manufactured by the method [1] as mentioned above.

<Boron Density Property>

Figure 2A:
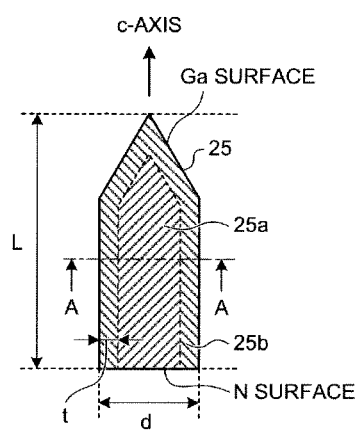
FIG. 2A is a sectional view illustrating an example of a structure of a gallium nitride crystal according to the embodiment.
Figure 2B:
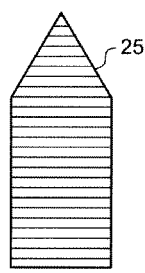
FIG. 2B is a sectional view illustrating another example of a structure of a gallium nitride crystal according to the embodiment.

FIG. 2A and FIG. 2B schematically show cross sections of gallium nitride crystal according to the embodiment. Incidentally, FIG. 2A and FIG. 2B illustrate cross sections parallel to the c-axis and the a-axis in the gallium nitride crystal 25 having a hexagonal crystal structure. In a preferred embodiment, the gallium nitride crystal 25 is elongated in the c-axis direction as illustrated in FIG. 2A, and has a "boron rich" region (the first region 25a) at inner side thereof and a "boron poor" region (the second region 25b) at outer side thereof. Alternatively, the gallium nitride crystal 25 may not have such a double layer structure made of the first region 25a and the second region 25b, as illustrate in FIG. 2B. Alternatively, the gallium nitride structure 25 may have a multiple layer structure more than double layers.

Generally, in the gallium nitride crystal 25, the upper surface of the six-sided pyramid-like part is comprised of Ga (gallium) surface, and the bottom surface of the hexagonal column-like part is comprised of N (nitrogen) surface. The Ga surface and the N surface can be distinguished by comparing shapes of both edges of the needle-like crystal.

Figure 3:
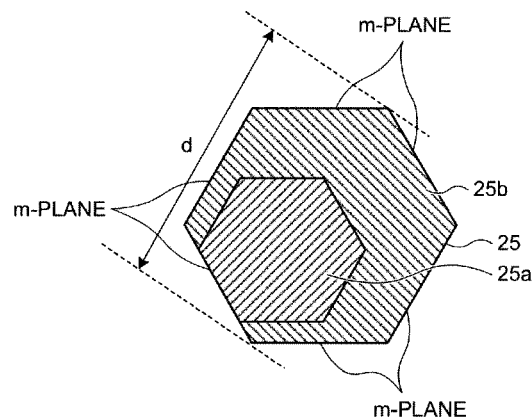
FIG. 3 is a sectional view illustrating an example of a c-plane cross section of a gallium nitride crystal according to the embodiment.
Figure 4:
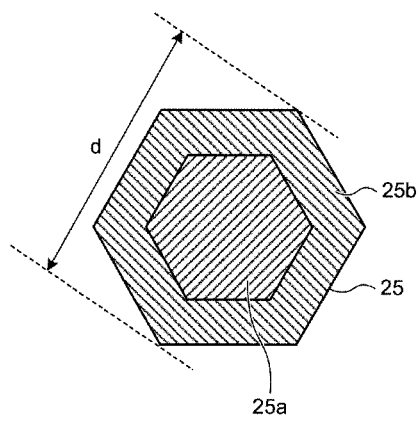
FIG. 4 is a sectional view illustrating another example of a c-plane cross section of a gallium nitride crystal according to the embodiment.

FIG. 3 and FIG. 4 show examples of the c-plane ({001} plane) cross section of the gallium nitride crystal 25. Namely, FIG. 3 is a cross section along A-A line in FIG. 2A. As illustrated in FIG. 3 and FIG. 4, the cross section orthogonal to the c-axis (c-plane) in the gallium nitride crystal 25 is a hexagon or almost hexagon. The surfaces of the gallium nitride crystal 25 corresponding to edges of the hexagon are comprised mainly of m-planes of the hexagonal crystal structure.

As illustrated in FIG. 3, in a preferred embodiment, the gallium nitride crystal 25 has preferably the boron rich region (the first region 25a) at inner side thereof in the c-plane cross section, and the boron poor region (the second region 25b) preferably surrounds at least a part of the first region 25a in the c-plane cross section. Thus, in a case that the gallium nitride crystal 25 in which the second region 25b surrounds at least a part of the outer periphery of the first region 25a is used as seed crystal, and the group 13 nitride crystal 27 is grown from the outer periphery of the seed crystal (FIG. 10A), the group 13 nitride crystal 27 grown from the second region 25b is likely to be of high quality.

Incidentally, the first region 25a and the second region 25b are included in the c-plane cross section. However, the embodiment is not limited to the precise c-plane cross section. Thus, it is sufficient that the first region 25a and the second region 25b are included in at least a cross section intersecting the c-axis.

In the gallium nitride crystal 25 of a preferred embodiment, the boron density of the first region 25a at the inner side is preferably $4 \times 10^{18}$ atms/cm$^3$ or more, the boron density of the second region 25b at the outer side is preferably less than $4 \times 10^{18}$ atms/cm$^3$ (see Examples).

In a further preferred embodiment, the second region 25b at the outer side preferably surrounds an entire outer periphery (i.e. all outer circumferential surfaces of the hexagonal shape comprised of generally m-planes) of the first region 25a at the inner side in a cross section intersecting the c-axis of the gallium nitride crystal 25 (FIG. 4).

FIG. 4 shows another example of the c-plane cross section of the gallium nitride crystal 25. As illustrated in FIG. 4, in a case that the second region 25b surrounds an entire periphery of the first region 25a comprised of m-planes, the group 13 nitride crystal 27 can be grown from the second region 25b, and thereby the higher quality region can be increased in the group 13 nitride crystal 27.

In the gallium nitride crystal 25 of a preferred embodiment, the thickness "t" (FIG. 2A) of the second region 25b at outer side is preferably 100 nm or more.

In a case that the group 13 nitride crystal is grown from GaN crystal as a seed crystal by a flux method, as described in Japanese Patent Application Laid-open No. 2009-126771, a melt-back of the seed crystal may arise. It is known that an amount of melt-back (melt-back amount) increases when the seed crystal has a low quality, especially the seed crystal includes an affected or damaged layer remained therein.

To the contrary, the gallium nitride crystal 25 according to the embodiment has 100 nm or more thickness of the second region 25b which is a high quality crystal layer at the outer side of the crystal. Thereby, even in a case that the melt-back arises in the course of growing the seed crystal 25, the second region 25b is likely to be remained. Therefore, the group 13 nitride crystal 27 of high quality can be easily formed.

<Emitting Property>

Figure 5:
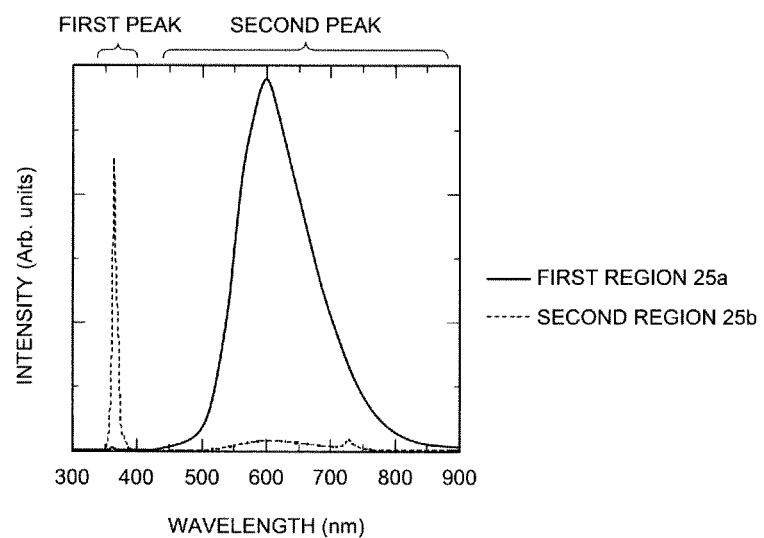
FIG. 5 is exemplary light emission spectra of a first region and a second region with electron beam or UV excitation.

FIG. 5 shows an example of emission spectra with electron beam or UV excitation of the first region 25a and the second region 25b (see Examples).

The gallium nitride crystal 25 according to the embodiment includes the first region 25a at an inner side of the cross section intersecting the c-axis of the gallium nitride crystal having the hexagonal crystal structure, and includes the second region 25b surrounding at least a part of the first region 25a in the cross section. In emission spectrum of the first region 25a with electron beam or UV excitation, the first peak including the band edge emission of GaN has the peak intensity smaller than that of the second peak which appears in longer wavelength area than the first peak. In emission spectrum of the second region 25b with electron beam or UV excitation, the first peak has the peak intensity greater than that of the second peak.

The first peak refers to a peak which includes the band edge emission of GaN and which appears around about 365 nm in the measurement at a room temperature. The band edge emission of GaN is an emission due to a recombination of holes in an upper edge of the valence band and electrons in bottom of the conduction band in the gallium nitride crystal 25, and means that the light having energy (wavelength) equal to the band gap is emitted. In other words, the first peak is a peak due to a periodic structure of the crystal and a combination (status) of nitrogen and gallium in the gallium nitride crystal 25. The first peak may include an emission in the vicinity of the band edge in addition to the band edge emission.

The second peak refers to at least one peak which appears in a longer wavelength area than the first peak, refers to a peak of emission spectrum due to reasons other than the band edge emission or the emission in the vicinity of the band edge of GaN, and refers to a peak due to reasons other than the combination of nitrogen and gallium.

In a more preferred embodiment, the second peak appears in a range from 450 nm to 650 nm with respect to an emission spectrum with electron beam or UV excitation when measured at a room temperature.

In a still more preferred embodiment, the second peak appears in a range from 590 nm to 650 nm with respect to an emission spectrum with electron beam or UV excitation when measured at a room temperature.

The room temperature refers to about 20 degrees Celsius, and refers to a range of about 10 degrees Celsius to 30 degrees Celsius. When the emission spectra with electron beam or UV excitation was measured at a temperature lower than the room temperature (e.g. −270 degrees Celsius), the second peak may split into a plurality of peaks. The second peak according to the embodiment may split into a plurality peak when measured at a temperature other than the room temperature, insofar as the second peak appears as a broad peak when measured at the room temperature.

The emission spectra with electron beam or UV excitation can be obtained by measuring PL (Photoluminescence) using He—Cd laser (helium-cadmium laser) as exciting light source. However, the embodiment is not limited to this. It is possible to observe colors or intensities of spectra by using fluorescence microscope. The first region 25a and the second region 25b can be distinguished or identified by observed colors.

A fact that the second peak has a peak intensity greater than that of the first peak as shown in the emission spectrum of the first region 25a means that the first region 25a contains a relatively large amount of impurities or defects. On the other hand, a fact that the first peak has a peak intensity greater than that of the second peak as shown in the emission spectrum of the second region 25b means that the second region 25b contains less impurities or defects and thereby the second region 25b is a high quality crystal.

The peak intensity of the first peak and the peak intensity of the second peak with respect to the first region 25a and second region 25b are not limited to any particular one, insofar as the aforementioned relationships are satisfied. In a prefer embodiment, the peak intensity of the first peak of the second region 25b is greater than the peak intensity of the first peak of the first region 25a. And, the peak intensity of the second peak of the second region 25b is smaller than the peak intensity of the second peak of the first region 25a.

Thus, in the embodiment, the second region 25b having less impurities or defects is located at an outer side in the cross section intersecting the c-axis of the gallium nitride crystal 25. Thereby, it is possible to manufacture the high quality group 13 nitride crystal 80, in a case that the group 13 nitride crystal 27 is grown from the gallium nitride crystal 25 as seed crystal.

The gallium nitride crystal 25 is not limited to the double-layered structure made of the first region 25a and the second region 25b. The gallium nitride crystal 25 may have a multi-layered structure more than double-layered (e.g. three-layered). Specifically, the gallium nitride crystal 25 may include other regions different from the first region 25a and the second region 25b in its structures or properties. Alternatively, the gallium nitride crystal 25 may include a plurality of first regions or second regions. Alternatively, the gallium nitride crystal 25 may include a region whose emission spectrum with electron beam or UV excitation has a weak intensity.

Figure 6:
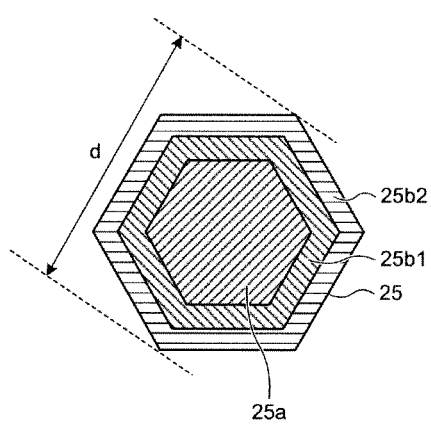
FIG. 6 is a sectional view illustrating another example of a c-plane cross section of a gallium nitride crystal according to the embodiment.

FIG. 6 schematically shows another example of the c-plane cross section of the gallium nitride crystal 25. As shown in FIG. 6, the second region 25b may be made of the second region 25b1 and the second region 25b2. In this case, the first peak of the second region 25b2 has a peak intensity smaller than that of the first peak of the second region 25b1. The second region 25b2 may be formed so as to surround the first region 25a or the second region 25b1.

<Other Structures>

Additives may be doped to the gallium nitride crystal 25 (the first region 25a and the second region 25b) according to the embodiment. Additives may be a doping impurity such as germanium (Ge), oxygen (O), silicon (Si) and the like, an acceptor impurity such as magnesium (Mg), lithium (Li), strontium (Sr), calcium (Ca), zinc (Zn) and so on, a transition metal for providing magnetic property such as iron (Fe), manganese (Mn), chromium (Cr) and the like, a rare earth element or the like for providing magnetic property or fluorescence such as europium (Eu), erbium (Er), terbium (Tb), thulium (Tm) and the like, congeners such as aluminum (Al), indium (In) and the like. Other additives may de selected and doped depending on the purpose.

In FIG. 3 and FIG. 4, the c-plane cross section of the gallium nitride crystal 25, the c-plane cross section of the first region 25a, and the c-plane cross section of the second region 25b are illustrated as regular hexagon, respectively. However, these drawings are only for illustrating examples. The c-plane cross section is not limited to the regular hexagon. The c-plane cross section of the gallium nitride crystal 25, the c-plane cross section of the first region 25a, and the c-plane cross section of the second region 25b are formed in generally hexagon due to the cross section of the gallium nitride crystal having a hexagonal crystal structure. In a case that other structure arises inside or at a boundary of these cross section in the course of the crystal growth, the outline of each hexagon may deform at the boundary with other structure.

[3] Manufacturing Method of Bulk Crystal from Seed Crystal

The manufacturing method of crystal according to the embodiment is a method of manufacturing a group 13 nitride crystal (e.g. gallium nitride crystal) by a flux method in which the gallium nitride crystal 25 mentioned in [2] is used as a seed crystal (seed crystal 25) and the c-plane cross section of the seed crystal 25 is enlarged.

<Crystal Manufacturing Apparatus>

Figure 7:
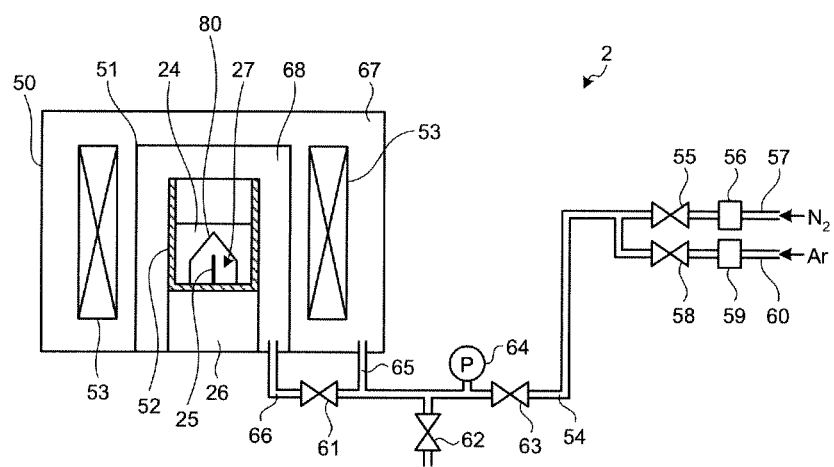
FIG. 7 is a schematic sectional view illustrating a crystal manufacturing apparatus to grow a seed crystal.

FIG. 7 schematically shows a crystal manufacturing apparatus 2 to grow a seed crystal 25. The apparatus 2 has a double vessel structure in which an inner vessel 51 is disposed in an outside pressure resistant vessel 50 made of stainless material, and a reactor vessel 52 is disposed in the inner vessel 51. The inner vessel 51 is attachable to and detachable from the outside pressure resistant vessel 50.

The reactor vessel 52 is for maintaining the seed crystal 25 with a molten mixture 24 of alkali metal and group 13 element-contained material in order to grow the seed crystal 25 (to grow the bulk crystal from seed crystal referred to as SG or Seed Growth).

Materials for the reactor vessel 52 are not limited to any particular material. For example, nitrides such as sintered BN, P-BN and the like, oxides such as aluminum, YAG and the like, carbides such as SiC and the like, and so on may be used. An inner wall of the reactor vessel 52, that is, a portion or portions of the reactor vessel 52 which contact(s) the molten mixture 29 is/are preferably made of material(s) insensitive to the molten mixture 24. As examples of materials allowing the crystal growth of gallium nitride, there may be nitrides such as boron nitride (BN), pyrolytic BN (P-BN), aluminum nitride and the like, oxides such as alumina, yttrium-aluminum-garnet (YAG) and the like, stainless steel (SUS) and so on.

To the outside pressure resistant vessel 50 and the inner vessel 51, gas pipes 65 and 66 are respectively connected to supply nitrogen ($N_2$) gas which is source material of the group 13 nitride crystal and a diluent gas for controlling a whole pressure to an inner space 67 of the outside vessel 50 and an inner space 68 of the inner vessel 51. A gas supplying pipe 54 is branched into a nitrogen supplying pipe 57 and a diluent gas supplying pipe 60 via valves 55 and 58, respectively. These pipes 57 and 60 can be separated at valves 55 and 58, respectively.

Argon (Ar) gas which is inert gas is preferably used as the diluent gas. However, the embodiment is not limited to this. For example, other inert gas such as helium (He) may be used as the diluent gas.

The nitrogen gas is introduced from the nitrogen supplying pipe 57 which is connected to a gas canister or the like containing the nitrogen gas therein. The nitrogen gas from the pipe 57 is subjected to a pressure control by a pressure regulator 56 and then supplied to the gas supplying pipe 54 via the valve 55. On the other hand, the diluent gas (e.g. Ar gas) is introduced from the diluent gas supplying pipe 60 which is connected to a gas canister or the like containing the diluent gas therein. The diluent gas from the pipe 60 is subjected to a pressure control by a pressure regulator 59 and then supplied to the gas supplying pipe 54 via the valve 58. Thus, the pressure regulated nitrogen gas and the pressure regulated diluent gas are supplied to the gas pipe 54 to be mixed there.

The gas mixture of the nitrogen gas and the diluent gas is supplied to the outside vessel 50 via the pipe 65 and the inner vessel 51 via the pipe 66. The inner vessel 51 can be removed from the apparatus 2 at the valve 61.

A pressure meter 64 is disposed on the pipe 54 for monitoring a whole pressure inside of the outside vessel 50 and the inner vessel 51 and controlling pressures inside of the outside vessel 50 and inner vessel 51.

In the embodiment, nitrogen partial pressure can be controlled by controlling the pressures of the nitrogen gas and the diluent gas by means of valves 55 and 58 and the pressure regulators 56 and 59. Since the whole pressure of the outside vessel 50 and the inner vessel 51 can be controlled, it is possible to reduce evaporation of alkali metal (e.g. sodium) in the reactor vessel 52 by increasing the whole pressure of the inner vessel 51. In other words, it is possible to control separately the nitrogen partial pressure which becomes a nitrogen source affecting the crystal growth conditions of GaN and the whole pressure which affects the reduction of sodium evaporation.

As shown in FIG. 7, a heater 53 is disposed around the outer circumference of the inner vessel 51 inside of the outside vessel 50 for heating the inner vessel 51 and the reactor vessel 52 and controlling the temperature of the molten mixture 24.

<Crystal Growth Process>

An operation to put the seed crystal 25, the source material, the flux material, additives and the like such as gallium (Ga), sodium (Na), and carbon (C) as dopant into the reactor vessel 52 is conducted in such a manner that the inner vessel 51 is put into a glove box under an inert gas atmosphere such as Ar. This operation may be conducted in a state that the reactor vessel 52 is set inside of the inner vessel 51.

To the reactor vessel 52, the seed crystal 25 mentioned in [2] is set or installed (the seed crystal installation process).

Figure 8:
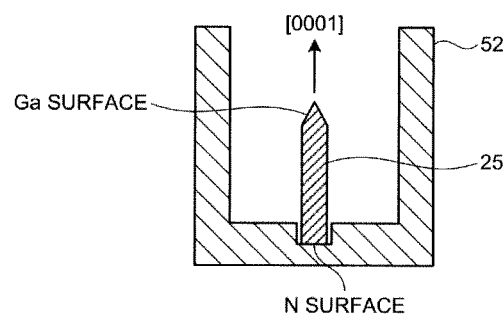
FIG. 8 is a schematic view illustrating an example of installation of the seed crystal.
Figure 9:
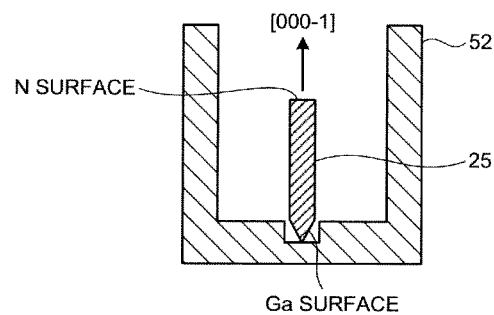
FIG. 9 is a schematic view illustrating another example of installation of the seed crystal.

An explanation will be made on the way of installing the seed crystal 25 with reference to FIG. 8 and FIG. 9. FIG. 8 and FIG. 9 schematically illustrate examples of ways of installing the seed crystal 25 (showing in section). As shown in FIG. 8 and FIG. 9, a hole (recess) having an inner diameter larger than an outer diameter of the seed crystal 25 is made in a bottom part of the reactor vessel 52. The seed crystal 25 is installed by inserting an edge of the seed crystal 25 into the hole (recess).

In a preferred embodiment, the seed crystal 25 is installed in the reactor vessel 52 so that Ga surface faces upward, as shown in FIG. 8.

In a preferred embodiment, the seed crystal 25 is installed in the rector vessel 52 so that N surface faces upward, as shown in FIG. 9.

In examples of FIG. 8 and FIG. 9, the seed crystal 25 is installed by inserting it into the hole or recess. However, the installation method is not limited to this. Other installation method may be used.

In a preferred embodiment, the seed crystal 25 to be installed inside the reactor vessel 52 is a gallium nitride crystal 25 having a hexagonal crystal structure in which a length in the c-axis direction is 9.7 mm or more, and the ratio L/d of the length "L" to the crystal diameter "d" in the c-plane is larger than 0.813.

Into the reactor vessel 52, material containing at least group 13 element (e.g. gallium) and material used as flux are put (the putting process).

Material used as flux may be sodium or compound thereof (e.g. sodium azide). Other alkali metals such as lithium, potassium and the like, or compounds of these alkali metals may be used as flux. Alkali earth metals such as barium, strontium, magnesium and the like, or compounds of these alkali earth metals may be used as flux. Plurality kinds of alkali metals or alkali earth metals may be used.

The material containing group 13 element as source material may be gallium which is one of group 13 elements. Any other materials including without limitation other group 13 elements such as boron, aluminum and indium, or mixtures thereof may be used as source material(s).

A mol ratio of the material containing or including the group 13 element to alkali metal is not limited to any particular one. However, the mol ratio of alkali metal to the total mol ratio of the alkali metal and the group 13 element is preferably 40 to 95%.

After the materials are set as mentioned above, the heater 53 is turned on to heat the inner vessel 51 and the reactor vessel 52 inside of the inner vessel 51 to a crystal growth temperature. Then, the source materials in the reactor vessel 52, which are the material containing or including group 13 element, alkali metal, and other additives, are melted in the reactor vessel 52 to form the molten mixture 24 (the molten mixture forming process).

By bring the nitrogen having the aforementioned partial pressure into contact with the molten mixture 24 and thereby dissolving the nitrogen into the molten mixture 24, the nitrogen which is a source material of the group 13 nitride crystal 27 can be supplied to the molten mixture 24 (the nitrogen dissolving process).

Figure 12:
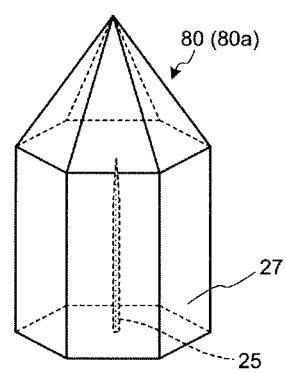
FIG. 12 is a perspective view illustrating an example of group 13 nitride crystal.
Figure 13:
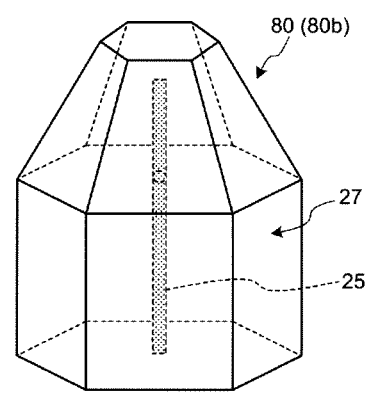
FIG. 13 is a perspective view illustrating an example of group 13 nitride crystal.

Source materials melted in the molten mixture 24 are supplied onto the outer circumference surface of the seed crystal 25, so that the group 13 nitride crystal 27 is grown from the outer circumference surface of the seed crystal 25 with the source materials. Thus, by growing the group 13 nitride crystal 27 from the seed crystal 25, the group 13 nitride crystal 80 as illustrated in FIG. 12 or FIG. 13 can be obtained (the crystal growth process).

Next, an explanation will be made on shapes of the group 13 nitride crystal 80 formed in the crystal growth process.

FIG. 10A, FIG. 10B, FIG. 11A and FIG. 11B illustrate the growth processes and crystal shapes of the group 13 nitride crystal 80.

Figure 10A:
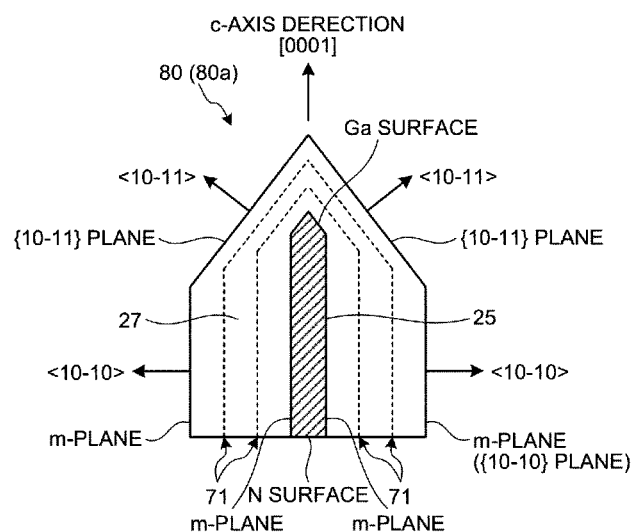
FIG. 10A is a schematic sectional view illustrating a growing process of group 13 nitride crystal and the crystal shape.

As illustrated in FIG. 10A, a preferable crystal growth process includes a process of forming an outer side periphery mainly including {10-10} plane and an outer side periphery mainly including {10-11} plane at the sides of the crystal, and forming an outer periphery mainly including {0001} plane at the bottom of the crystal (see Example 1).

Figure 10B:
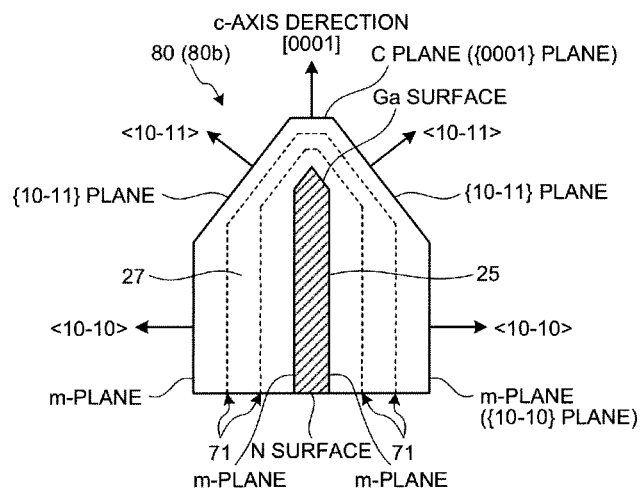
FIG. 10B is a schematic sectional view illustrating a growing process of group 13 nitride crystal and the crystal shape.
Figure 11A:
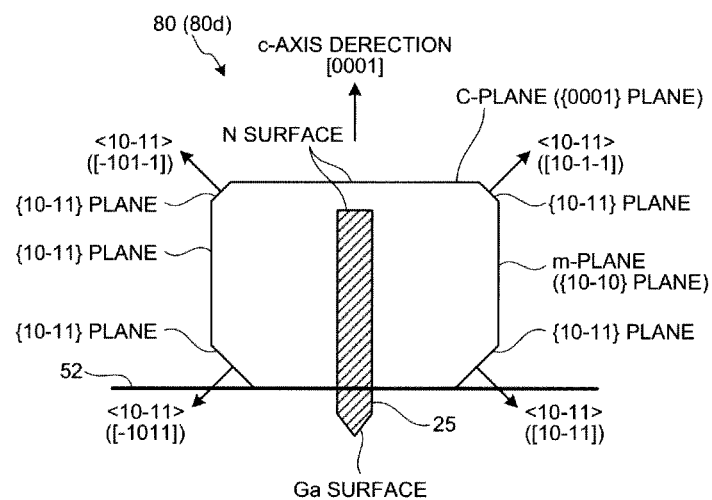
FIG. 11A is a schematic sectional view illustrating a growing process of group 13 nitride crystal and the crystal shape.
Figure 11B:
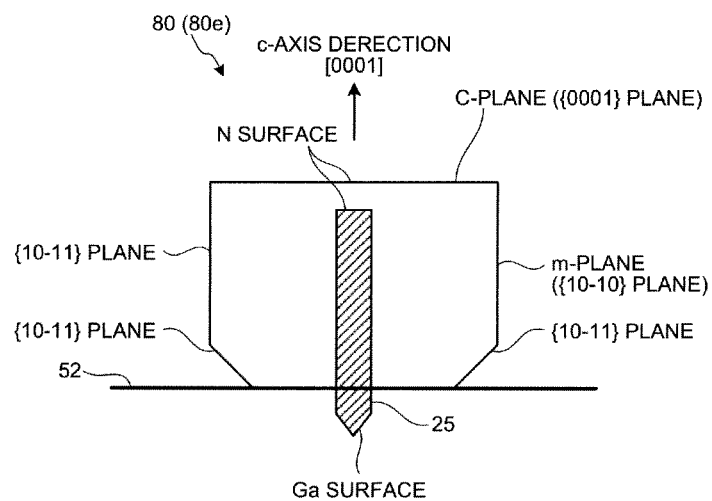
FIG. 11B is a schematic sectional view illustrating a growing process of group 13 nitride crystal and the crystal shape.

As illustrated in FIG. 10B, FIG. 11A and FIG. 11B, a preferable crystal growth process includes a process of forming outer peripheries mainly including {0001} plane at the top face and the bottom face of the crystal, and forming an outer side periphery mainly including {10-10} plane and an outer side periphery mainly including {10-11} plane at the sides of the crystal (see Example 2).

In the crystal growth process of the embodiment, a growth rate in <10-10> direction (the m-axis direction) is the fastest in the crystal growth rate of the group 13 nitride crystal 27. Next, the growth rate in [0001] direction (the c-axis direction at Ga surface side), and the growth rate in <10-11> direction having Ga surface side component follows. The growth rate in [000-1] direction (the c-axis direction at N surface side), and the growth rate in <10-11> direction having N surface side component are slow in comparison with the other growth rates.

In other words, the relationship (inequation) represented by (Growth Rate in <10-10> direction)>(Growth Rate in Ga Surface Direction)>(Growth Rate in N Surface Direction) is established. Thereby, the outer shape of the group 13 nitride crystal obtained through the crystal growth process according to the embodiment becomes shapes as illustrated in FIG. 10A, FIG. 10B, FIG. 11A and FIG. 11B.

The <10-11> direction having Ga surface side component means a direction in which the value "1" of hexagonal crystal index [hkil] has a positive value in the <10-11> direction. As examples, [10-11] direction and [−1011] direction are illustrated in FIG. 11A.

The <10-11> direction having N surface side component means a direction in which the value "1" of hexagonal crystal index [hkil] has a negative value in the <10-11> direction. As examples, [10-1-1] direction and [−101-1] direction are illustrated in FIG. 11A.

Next, an explanation will be made on shapes of crystal obtained through the crystal growth process according to the embodiment, with reference to FIG. 10A and FIG. 10B.

As illustrated in FIG. 10A and FIG. 10B, an explanation will be made on cases that the gallium nitride crystal 25 is installed in the reactor vessel 52 so that Ga surface faces upward.

As aforementioned, the growth rate in [0001] direction, the growth rate in <10-10> direction and the growth rate in <10-11> direction having Ga surface side component are relatively fast. Thereby, the group 13 nitride crystal 27 is likely to be formed into a shape as illustrated in FIG. 10A or FIG. 10B.

If the growth rate in <10-11> direction having Ga surface side component is faster than the growth rate in direction, the crystal is likely to be formed into a shape as illustrated in FIG. 10A. On the other hand, if the growth rate in <10-11> direction having Ga surface side component is slower than the growth rate in [0001] direction, the crystal is likely to be formed into a shape as illustrated in FIG. 10B.

Next, an explanation will be made on cases that the gallium nitride crystal 25 is installed into the reactor vessel 52 so that N surface faces upward.

As aforementioned, the growth rate in a direction at N surface side, that is, the growth rate in [000-1] direction and the growth rate in <10-11> direction having N surface side component are slower than the growth rate in <10-10> direction. Thereby, the group 13 nitride crystal 27 is likely to be formed into shapes as illustrated by FIG. 11A and FIG. 11B.

If the growth rate in <10-11> direction having N surface side component is faster than the growth rate in [000-1] direction, the crystal is likely to be formed into a shape as illustrated in FIG. 11A. On the other hand, the growth rate in <10-11> direction having N surface side surface component is slower than the growth rate in [000-1] direction, the crystal is likely to be formed into a shape as illustrated in FIG. 11B.

In FIG. 10A and FIG. 10B, the group 13 nitride crystal 27 are illustrated with growth striations 71 which appears in accordance with the crystal growth. However, the group 13 nitride crystal 27 may or may not have the growth striation 71.

Through the crystal growth process according to the preferred embodiment, the gallium nitride crystal 25 having a hexagonal crystal structure in which the length "L" in the c-axis direction is 9.7 mm or more, and the ratio L/d of the length "L" to the crystal diameter "d" is larger than 0.813 is used as seed crystal, and the group 13 nitride crystal 27 having a hexagonal crystal structure is grown to form the group 13 nitride crystal 80. By forming the group 13 nitride crystal 80 from the seed crystal 25 having such a shape, a crystal substrate can be fabricated with high quality and practical size. The detail about this will be described later in the following [7] and [8].

In a preferred embodiment, the partial pressure of nitrogen gas in the inner space 68 of the inner vessel 51 and the inner space 67 of the outer pressure resistant vessel 50 is at least 0.1 MPa or more. In a more preferred embodiment, the partial pressure of nitrogen gas in the inner space 68 of the inner vessel 51 and the inner space 67 of the outer pressure resistant vessel 50 is in a range of 2 MPa to 5 MPa.

In a preferred embodiment, the temperature of the molten mixture 24 (the crystal growth temperature) is at least 700 degrees Celsius or more. In a more preferred embodiment, the crystal growth temperature is in a range of 850 degrees Celsius to 900 degrees Celsius.

In a case that the group 13 nitride crystal 27 is grown from the seed crystal 25, the dislocation density of the group 13 nitride crystal 27 grown mainly from the outer periphery comprised of m-planes of the seed crystal 25 is considered to be affected by the quality of the outer periphery comprised of m-planes of the seed crystal 25. As aforementioned in [2], the outer periphery comprised of en-planes of the seed crystal 25 is of high quality with low dislocation density. Thereby, by growing the group 13 nitride crystal 27 from the seed crystal 25, it is possible to reduce the propagation of the dislocation from the seed crystal 25 to the group 13 nitride crystal 27. Therefore, the dislocation density of the group 13 nitride crystal 27 can be restricted to a small extent, and thereby the group 13 nitride crystal 80 can be more readily manufactured with higher quality and larger sized.

In the crystal manufacturing e hod according to the embodiment, the same material (e.g. gallium nitride) may be used for the seed crystal 25 and the group 13 nitride crystal 27 grown from the seed crystal 25. Therefore, different from a case that hetero material such as aluminum nitride (AlN) is used as the seed crystal, the lattice constant and the thermal expansion coefficient can be matched and thereby the occurrence of the dislocation due to the difference in the lattice constant or thermal expansion coefficient can be suppressed.

The seed crystal 25 and the group 13 nitride crystal 27 are manufactured by the same or similar crystal manufacturing method (flux method). Therefore, in comparison with a case that the seed crystal 25 and the group 13 nitride crystal 27 are manufactured by the different method from each other, it is possible to improve the matching of the lattice constant or the thermal expansion coefficient, and thereby easily suppress the occurrence of dislocation.

As aforementioned, according to the crystal manufacturing method of embodiment, it is possible to manufacture the group 13 nitride crystal 80 of high quality with low dislocation density and of practical size.

In the above embodiment, the explanation was focused on the flux method for the crystal manufacturing method. However, the crystal manufacturing method is not limited to any particular one. For example, a vapor phase growth method such as HYPE, or any other liquid phase growth method than flux method may be used for the crystal growth.

[4] Group 13 Nitride Crystal

The group 13 nitride crystal according to the embodiment is a group 13 nitride crystal 80 manufactured by the manufacturing method as mentioned in [3]. Therefore, the group 13 nitride crystal 80 according to the embodiment includes, at the inner side thereof, at least a part of the gallium nitride crystal 25 mentioned in [2].

FIG. 12 and FIG. 13 show perspective views or appearances of group 13 nitride crystals 80 (80a and 80b) according to the embodiment. As illustrated in FIG. 12 and FIG. 13, the seed crystals 25 are contained in the group 13 nitride crystal 80a (FIG. 12) and the group 13 nitride crystal 80b (FIG. 13).

Figure 14:
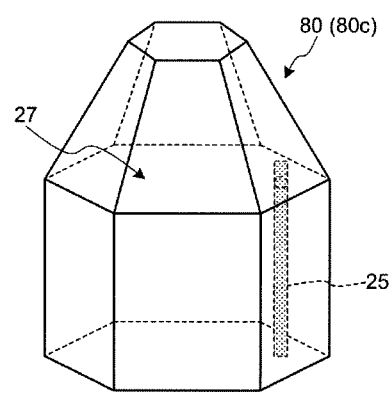
FIG. 14 is a perspective view illustrating an example of group 13 nitride crystal.

FIG. 14 shows a perspective view or appearance of another example of the group 13 nitride crystal 80c. It is sufficient that the seed crystal 25 is located inside of the group 13 nitride crystal 80. Thus, the seed crystal 25 may be located around the center (around the center of the hexagonal cross section) of the group 13 nitride crystals 80a and 80b, as shown in FIG. 12 and FIG. 13. Alternatively, the seed crystal 25 may be located around the periphery (in an area closer to edges of the hexagon than the center) of the group 13 nitride crystal 80c, as shown in FIG. 14. Furthermore, the group 13 nitride crystal 80 may have a shape further enlarged to the m-axis direction.

In the group 13 nitride crystal BO, additives may be doped in the group 13 nitride crystal 27. Examples of additives include a doping impurity such as germanium (Ge), oxygen (O), silicon (Si) and the like, an acceptor impurity such as magnesium (Mg), lithium (Li), strontium (Sr), calcium (Ca), zinc (Zn) and the like, a transition metal for providing magnetic property such as iron (Fe), manganese (Mn), chromium (Cr) and the like, a rare earth element or the like for providing magnetic property or fluorescence such as europium (Eu), erbium (Er), terbium (Tb), thulium (Tm) and the like, congeners such as aluminum (Al), indium (In) and the like. Other additives may de selected and doped depending on the purpose.

<Dislocation Density>

In the crystal manufacturing method according to the embodiment, the group 13 nitride crystal 27 grown from the seed crystal and the gallium nitride crystal 25 used as the seed crystal can be of the same gallium nitride. Different from a case that hetero material such as sapphire or aluminum nitride is used as the seed crystal, the lattice constant or thermal expansion coefficient can be matched, and thereby the occurrence of the dislocation due to the difference in the lattice constant or the thermal expansion coefficient can be suppressed. Furthermore, according to the embodiment, the second region 25b having less impurities or defects is disposed at outer side in the cross section intersecting the c-axis of the gallium nitride crystal 25. Thereby, the high quality group 13 nitride crystal 27 can be manufactured when the group 13 nitride crystal 27 is grown from the gallium nitride crystal 25 as seed crystal. Namely, it is further possible to suppress the dislocation which may occur at a boundary surface of the gallium nitride crystal 25 used as seed crystal.

Figure 15:
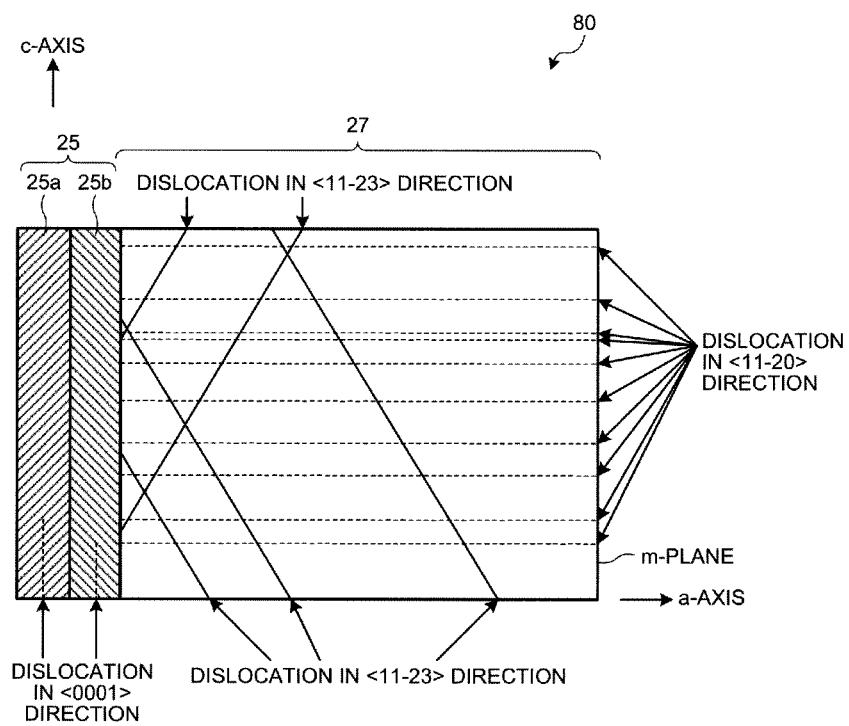
FIG. 15 is a schematic sectional view illustrating dislocations in a cross section parallel to the c-axis and the a-axis of a group 13 nitride crystal.

Next, an explanation will be made on the dislocation in the crystal with reference to FIG. 15. FIG. 15 schematically shows dislocations in a cross section parallel to the c-axis and the a-axis in the group 13 nitride crystal 80. Incidentally, FIG. 15 only shows an enlarged right part from the seed crystal 25 in a a-plane cross section of the group 13 nitride crystal 80.

In the embodiment, the group 13 nitride crystal 27 grown from the seed crystal 25 is grown mainly from en-planes comprising the outer periphery of the seed crystal 25 toward the m-axis direction (i.e. a direction in which the c-plane cross section of the hexagon enlarges). Therefore, the dislocations occurred at the growth boundary surface of the seed crystal 25 are likely to be oriented in <11-20> direction parallel to the crystal growth direction and are not likely to be oriented in <11-23> direction unparallel to the crystal growth direction.

With regard to the dislocation direction intersecting the c-plane cross section of the group 13 nitride crystal having a hexagonal crystal structure, there are <0001>direction and <11-23> direction. In the embodiment, however, the dislocation in the <0001> direction does not occur and the dislocation in the <11-23> direction occurs quite a few.

Therefore, in a preferred embodiment, the dislocation density of the group 13 nitride crystal 27 (a region other than the seed crystal 25 in the group 13 nitride crystal 80) is smaller than that of the gallium nitride crystal 25 contained inside of the group 13 nitride crystal 27.

[5] Fabrication Method of Crystal Substrate

The fabrication method of the crystal substrate according to the embodiment is a method of fabricating the crystal substrate 100 from the group 13 nitride crystal 80 mentioned in [4].

Figure 16:
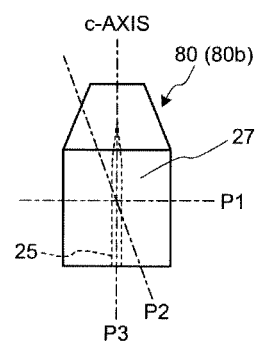
FIG. 16 is a schematic view illustrating a direction to slice a group 13 nitride crystal.
Figure 17:
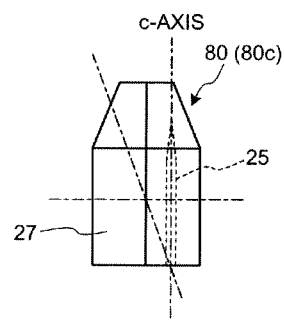
FIG. 17 is a schematic view illustrating a direction to slice a group 13 nitride crystal.

FIG. 16 and FIG. 17 schematically show direction for slicing the group 13 nitride crystal 80b (FIG. 13) and the group 13 nitride crystal 80c (FIG. 14). FIGS. 18A to 18C, and FIGS. 19A to 19C schematically show examples of crystal substrate 100 (100a to 100f) obtained through slicing.

Figure 18A:
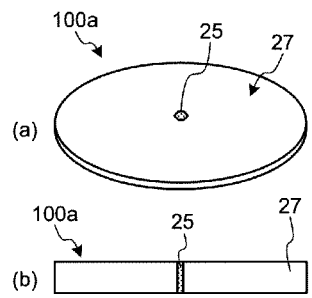
FIG. 18A is a schematic view illustrating an example of crystal substrate.
Figure 18B:
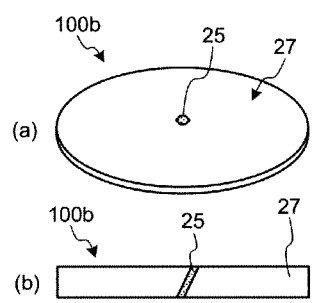
FIG. 18B is a schematic view illustrating an example of crystal substrate.
Figure 18C:
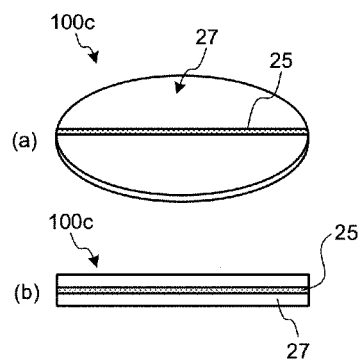
FIG. 18C is a schematic view illustrating an example of crystal substrate.

The fabrication method according to the embodiment includes a process of cutting out the crystal substrate 100 so as to include at least a part of the seed crystal 25 when the group 13 nitride crystal 80 is sliced. For example, the crystal substrate 100a as shown in FIG. 18A can be obtained by cutting or slicing crystal BO orthogonal to the c-axis of the seed crystal 25 as shown by a dotted-dashed line P1 in FIG. 16. Alternatively, the crystal substrate 100b as shown in FIG. 18B can be obtained by cutting or slicing the crystal 80 oblique to the c-axis of the seed crystal 25 as shown by a dotted-dashed line P2 in FIG. 16. Alternatively, the crystal substrate 100c as shown in FIG. 18C can be obtained by cutting or slicing the crystal 80 along the c-axis of the seed crystal 25 as shown by a dotted-dashed line P3 in FIG. 16.

The crystal substrate 100 as shown in FIGS. 18a to 18C and FIGS. 19A to 19C (100a to 100f) can be obtained through various treatments such as forming or shaping process, surface treatment and the like after slicing.

According to the fabrication method of the embodiment, it is possible to obtain a large area of main face of the substrate, since the crystal substrate 100 is cut out from the group 13 nitride crystal 80 enlarged in the c-axis direction as mentioned above, whether the substrate is cut out along the c-plane or along a plane other than the c-e. Namely, according to the embodiment, it is possible to fabricate the crystal substrate 100 having a large area and a main face comprised of any crystal plane such as c-plane, m-plane, a-plane, {10-11} plane, {20-21} plane, {11-22} plane and so on. Therefore, it is possible to fabricate the crystal substrate 100 of practical size applicable to various semiconductor devices.

According to the fabrication method of the embodiment, the crystal substrate 100 is fabricated by slicing the bulk crystal of the group 13 nitride (the group 13 nitride crystals 80 to 83). Different from the prior art, the method does not include a process of separating a thick crystal film from the hetero material substrate on which the crystal is grown and which has a thermal expansion coefficient and a lattice constant considerably different from that of the crystal thereon. Thereby, cracks hardly occur in the crystal substrate 100 according to the fabrication method of the embodiment. Therefore, it is possible to fabricate the crystal substrate 100 of higher quality in comparison with the prior art.

[6] Crystal Substrate

The crystal substrate according to the embodiment is a crystal substrate 100 fabricated by the fabrication method mentioned in [5]. Namely, the crystal substrate 100 of the embodiment characteristically includes at least a part of the seed crystal 25 mentioned in [2].

As shown in FIGS. 18A to 18C and FIGS. 19A to 19C, the seed crystal 25 used in the crystal manufacturing process mentioned in [3] is included in the crystal substrate 100 of the embodiments (100a to 100f). At least a part of the outer periphery comprised of m-planes of the seed crystal 25 is surrounded by the group 13 nitride crystal 27 grown from the seed crystal 25.

In a more preferred embodiment, an entire outer periphery comprised of m-planes of the seed crystal 25 is surrounded by the group 13 nitride crystal 27.

Insofar as the seed crystal 25 is included inside of the group 13 nitride crystal 27, the position thereof is not limited to any particular one. For example, as shown in FIG. 18A and FIG. 18B, the seed crystal 25 may be disposed around the center part of the main face of the crystal substrate 100. In this case, the c-axis of the seed crystal 25 may be disposed perpendicular to the main face as shown in FIG. 18A, or may be disposed oblique to the main face as shown in FIG. 18B.

Figure 19A:
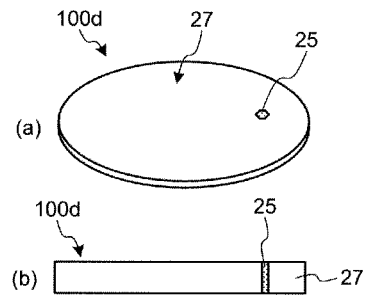
FIG. 19A is a schematic view illustrating an example of crystal substrate.
Figure 19B:
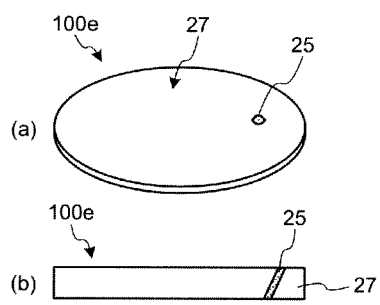
FIG. 19B is a schematic view illustrating an example of crystal substrate.
Figure 19C:
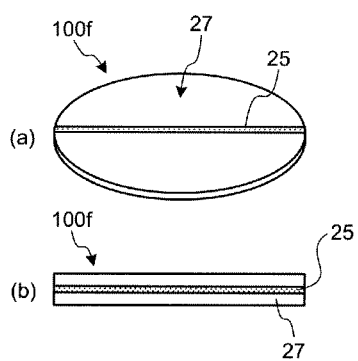
FIG. 19C is a schematic view illustrating an example of crystal substrate.

As shown in FIG. 18C and FIG. 19C, the seed crystal 25 may be disposed so that the c-axis of the seed crystal 25 is parallel to the main face of the substrate. Furthermore, the seed crystal 25 may be disposed at a position other than the center area of the main face of the substrate 100. For example, as shown in FIG. 19A and FIG. 19B, the seed crystal 25 may be disposed near the periphery of the main face of the substrate 100.

In a preferred embodiment, the c-plane of the hexagonal crystal structure becomes a main face of the crystal substrate 100.

As mentioned above, the dislocation extending through the c-plane (line defect) is likely to be reduced in the group 13 nitride crystal 27 in a preferred embodiment. Therefore, when the crystal substrate 100 having a main face comprised of c-plane is fabricated from the group 13 nitride crystal 80, the line defect extending in the c-axis direction can be reduced and a high quality crystal substrate 100 can be obtained.

[7] Preferred Shapes of Group 13 Nitride Crystal (Bulk Crystal)

Figure 20A:
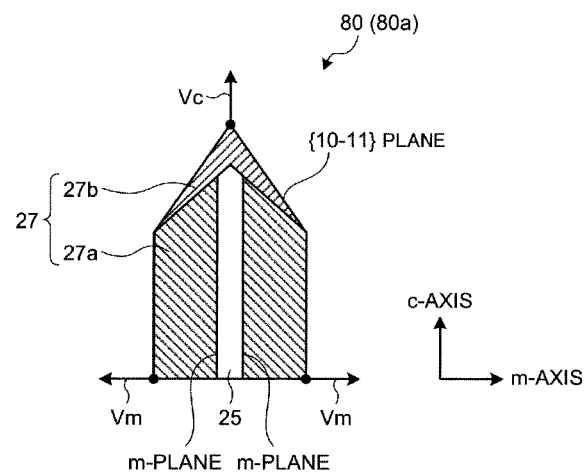
FIG. 20A is a schematic view illustrating a process of growing a group 13 nitride crystal from a seed crystal.
Figure 20B:
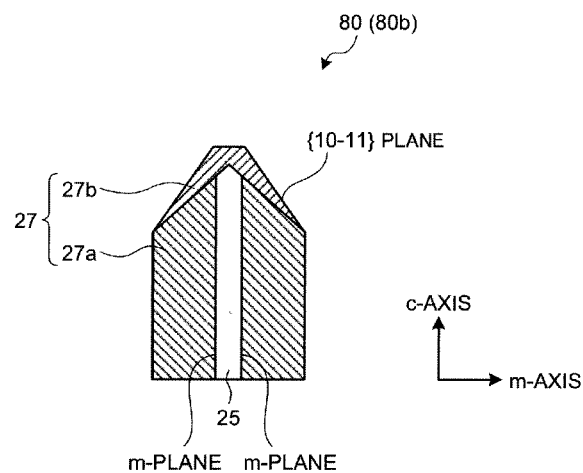
FIG. 20B is a schematic view illustrating a process of growing a group 13 nitride crystal from a seed crystal.

Next, an explanation will be made on preferred shapes of the group 13 nitride crystal 80. FIG. 20A and FIG. 20B schematically show examples of the crystal growth of the group 13 nitride crystal 27 from the seed crystal 25. Incidentally, a m-plane cross section of the group 13 nitride crystal 80 is illustrated in FIG. 20A and FIG. 20B, respectively.

As shown in FIG. 20A and FIG. 20B, it is considered that the group 13 nitride crystal 27 grown from the seed crystal 25 includes a region 27a and a region 27b. The region 27a is grown mainly toward the m-axis direction (i.e. a direction in which the c-plane cross section of the hexagon enlarges) from the m-plane comprising the outer periphery of the seed crystal 25. The region 27 *b* is grown mainly from a slanted surface including {10-11} plane of the seed crystal 25 or from a slanted surface including {10-11} plane on the top of the region 27*a* toward <10-11> direction.

In the region 27*b*, the growth rate of forming {10-11} plane is considered to be the slowest or rate controlling. Thereby, the group 13 nitride crystal 27 grown around the upper part of the seed crystal 25 is considered to often become a six-sided pyramid-like shape as shown in FIG. 20A. In a case that the growth rate of forming the c-plane ({0001} plane) is the slowest or rate controlling, the upper part of the crystal 27 may be a truncated six-sided pyramid-like shape in which a top part of the pyramid is cut along the c-plane.

Figure 21A:
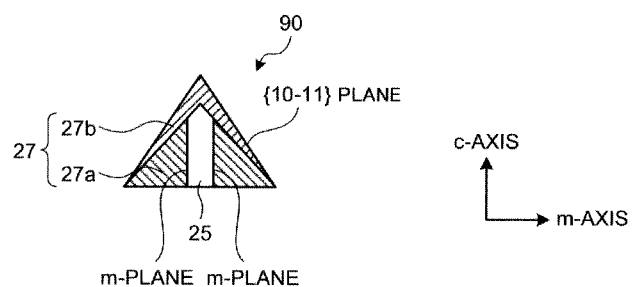
FIG. 21A is a schematic view illustrating a process of growing a group 13 nitride crystal from a seed crystal.
Figure 21B:
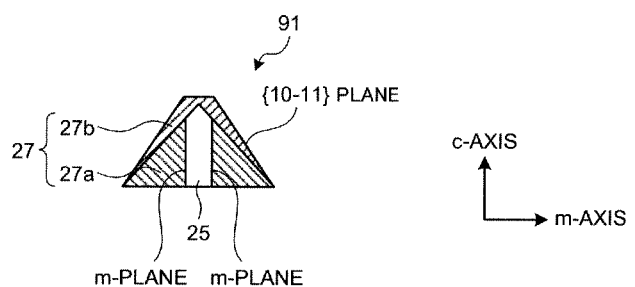
FIG. 21B is a schematic view illustrating a process of growing a group 13 nitride crystal from a seed crystal.

FIG. 21A and FIG. 21B schematically show examples of the crystal growth when the length "L" (FIG. 2A) in the c-axis direction of the seed crystal 25 is short. In a case that the length "L" of the seed crystal 25 is not long enough, the ratio of the six-sided pyramid part to the hexagonal column-like part is large. Therefore, the region 27*b* grown toward the <10-11> direction has a larger volume ratio to the region 27*a* grown toward the m-axis direction. Therefore, the group 13 nitride crystals 90, 91 are likely to be shapes illustrated FIG. 21A and FIG. 21B. In these cases, the region 27*b* is included all the c-planes.

The region 27*a* is a region whose crystal growth is started from the outer periphery comprised of m-planes of the seed crystal 25. As mentioned relating to FIG. 15, the group 13 nitride crystal 27 (the region 27*a*) grown mainly from the m-planes of the seed crystal 25 is considered to have relatively less dislocation extending through the t-axis direction. Therefore, when the crystal substrate 100 (100*a*, 100*b*, 100*d*, 100*e*) whose main face is a c-plane is fabricated, the region 27*a* is preferably contained or included as much as possible.

In FIG. 20A and FIG. 20B, if the crystal substrate 100 is fabricated by using a lower par of the group 13 nitride crystal 80, that is, a hexagonal column-like part without including the region 27*b*, it is possible to obtain the crystal substrate 100 including no region 27*b* considered to be grown from planes other than m-planes.

On the other hand, if the crystal substrate 100 is fabricated by using the group 13 nitride crystal 90 or 91 as shown in FIG. 21A or 21B, the obtained substrate 100 includes both the region 27*a* and the region 27*b*. Generally, regions grown toward different directions often have different properties from each other. Furthermore, the seed crystal and the crystal grown from the seed crystal often have different properties. Therefore, the substrate 100 fabricated from the crystal 90 or 91 as shown in FIG. 21A or 21B has three regions, that is, the regions 27*a* and 27*h*, and the seed crystal 25. This may lower the quality of the substrate 100.

Therefore, in a preferred embodiment, the group 13 nitride crystal 80 is of a shape including a hexagonal column-like part at the lower part of the crystal. However, the preferred shape is not limited to examples of FIG. 20A and FIG. 20B. For example, the group 13 nitride crystal may grow from the seed crystal 25 mainly toward the m-axis direction and mainly have a hexagonal column-like shape.

[8] Preferred Size of Seed Crystal

Next, an explanation will be made on the shape of the seed crystal 25 suitable for manufacturing the group 13 nitride crystal 80 having the suitable shapes mentioned in [7]. The gallium nitride crystal 25 has a hexagonal crystal shape in which an angle formed between the "a+c"-axis (<11-23> direction) and the c-plane is 58.4 degrees. If the ratio L/d of the length "L" (FIG. 2A) in the c-axis direction of the gallium nitride crystal 25 to the crystal diameter "d" in the c-plane cross section is 0.813, the gallium nitride crystal 25 becomes a six-sided pyramid-like shape.

As mentioned in [7], in order to obtain the good quality of the group 13 nitride crystal 80, the group 13 nitride crystal 27 is preferably grown mainly from the outer surface comprised of m-planes of the seed crystal 25. In a preferred embodiment, the seed crystal 25 includes m-planes as the outer periphery.

Figure 22:
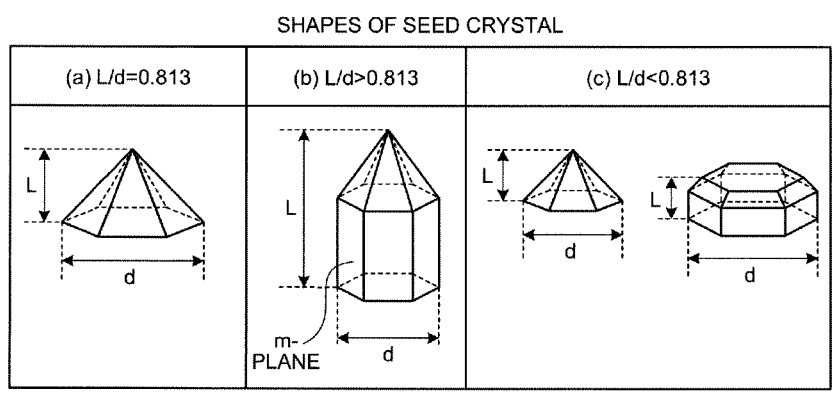
FIG. 22 is a schematic view illustrating various relationships between a seed crystal shape and L/d.

FIG. 22 schematically shows various relationships between the ratio L/d and the shape of the seed crystal 25. As shown in FIG. 22, if the ratio L/d equals to 0.813 (L/d=0.813), the seed crystal 25 becomes a six-sided pyramid-like shape. If the ratio L/d is greater than 0.813 (L/d>0.813), the upper part becomes a six-sided pyramid-like shape and the lower part becomes a hexagonal column-like shape. And the outer periphery (side surfaces) of the seed crystal 25 includes m-planes. If the ratio L/d is smaller than 0.813 (L/d<0.813), the seed crystal 25 becomes a six-sided pyramid-like shape without including any m-plane, or becomes a shape having a truncated six-sided pyramid-like part without a top part of the pyramid and having a low profile hexagonal column-like part including the m-planes.

Therefore, in a preferred embodiment, the ratio L/d is greater than 0.813 in the seed crystal 25, in which "L" is the length in the c-axis direction and d is a crystal diameter in the c-plane.

The practical size of the crystal substrate 100 is preferably a half-inch (12.7 mm) or 2 inches (5.08 cm). In the following explanation, the explanation will be made on the size of the seed crystal 25 required in a case that group 13 nitride crystal substrate 100 having the c-plane as main face has a diameter of half-inch (12.7 mm) or more, or a diameter of 2 inches or more is to be fabricated.

In the following explanation, as an example of the minimum thickness required for the practical substrate, a case that the thickness of the crystal substrate 100 is 1 mm is simulated. However, the required minimum thickness is not limited to this, and can be simulated as appropriate.

In order for the diameter of the crystal substrate 100 to be 12.7 mm, that is, for the diameter "d" of the group 13 nitride crystal 80 to be 12.7 mm, the group 13 nitride crystal 27 is required to be grown to a radius direction (the m-axis direction) by 6.35 ram, if the diameter of the seed crystal 25 is neglected as zero.

For example, if the crystal growth rate Vm in the m-axis direction is assumed to be twice of the crystal growth rate Vc in the c-axis direction, the crystal is grown about 3.2 mm in the c-axis direction while grown 6.35 mm in the m-axis direction. As mentioned above, the ratio L/d is greater than 0.813 (L/d>0.813). Therefore, in order for the crystal diameter "d" (the diameter of the bottom surface of the hexagonal column-like part) to be 12.7 mm, the length "L" in the c-axis direction (the height of the six-sided pyramid-like part) is 11.9 mm. Therefore, the required length of the seed crystal 27 is calculated as "11.9−3.2=8.7" mm. That is, the minimum length of the seed crystal 25 required for obtaining the group 13 nitride crystal 80 having the six-sided pyramid-like shape as shown in FIG. 20 is 8.7 mm. It is desired that a hexagonal column-liked region is formed under the six-sided pyramid-like part. If the required thickness of the crystal substrate 100 is assumed as 1 mm or more, the required length "L" in the c-axis direction of the seed crystal 25 is estimated as 9.7 mm.

Thus, in a preferred embodiment, the length "L" in the c-axis direction of the seed crystal 25 is preferably 9.7 mm or more.

In a more preferred embodiment, as for the seed crystal 25, the ratio L/d (the ratio of the length "L" in the c-axis direction to the diameter d in the c-plane) is preferably greater than 0.813, and the length "L" is preferably 9.7 mm or more. More preferably, L/d is greater than 7, and still more preferably, L/d is greater than 30.

As described above, according to the preferred embodiment, it is possible to fabricate the crystal substrate 100 having the diameter of the c-plane that is half-inch. As mentioned above, since the group 13 nitride crystal 80 grown from the m-plane of the seed crystal 25 is of high quality, a large and high quality crystal substrate 100 can be fabricated.

In order to obtain the crystal substrate 100 having the diameter of 2 inches (5.08 cm), the required length "L" in the c-axis direction of the seed crystal 25 is estimated as 37.4 mm or more.

Therefore, in a preferred embodiment, the length "L" in the c-axis direction of the seed crystal 25 is preferably 37.4 mm or more. Thereby, it is possible to fabricate the crystal substrate 100 having the diameter in the c-plane that is 2 inches. As mentioned above, since the group 13 nitride crystal 80 grown from the m-plane of the seed crystal 25 is of high quality, a large diameter and high quality crystal substrate 100 of the gallium nitride can be fabricated.

EXAMPLES

Examples will be shown below for further understanding the invention. However, the invention is not limited to these examples. The reference numerals in the following explanation correspond to the construction or configuration of the crystal manufacturing apparatus 1,2 explained with reference to FIG. 1 and FIG. 7. In Examples, the group 13 nitride crystal 80a (FIG. 10A) and the group 13 nitride crystal 80e (FIG. 11B) were manufactured by the crystal manufacturing method mentioned in [3].

<Seed Crystal>

An explanation is made on the seed crystal 25 used in Examples. The seed crystal 25 was manufactured by using the crystal manufacturing apparatus 1 illustrated in FIG. 1. Reference numerals in the following explanation correspond to the construction of the apparatus 1 explained with reference to FIG. 1. In this Example, as an example of the method (1), gallium having the nominal purity of 99.99999% and sodium having the nominal purity of 99.95% were input with a mol ratio as 0.25:0.75 into the reactor vessel 12 made of a sintered BN and having the inner diameter of 92 mm.

In a glove box, the reactor vessel 12 was placed into the inner vessel 11 under a high purity Ar gas atmosphere. The valve 31 was closed to shut out the inner space of the reactor vessel 12 from the outer atmosphere, so that the inner vessel 11 was sealed under the state filled with Ar gas. Then, the inner vessel 11 was taken out from the glove box and then assembled into the crystal manufacturing apparatus 1. Specifically, the inner vessel 11 was installed at a predetermined position with respect to the heater 13 and connected to the gas supplying pipe 14 of nitrogen gas and argon gas at the valve 31 portion.

Next, after argon gas was purged from the inner vessel 11, the nitrogen gas was introduced from the nitrogen supplying pipe 17. The nitrogen gas was subjected to the pressure control by the pressure regulator 16, and the valve 15 was opened, so that the nitrogen pressure in the inner vessel 11 was 3.2 MPa. Then, the valve 15 was closed and the pressure regulator 16 was set at 8 MPa. Then, the heater 13 was turned on to heat the reactor vessel 12 to a crystal growth temperature. In this Example, the crystal growth temperature was 870 degrees Celsius.

At the crystal growth temperature, gallium and sodium in the reactor vessel 12 were melted to form a molten mixture 24. The temperature of the molten mixture 24 was the same as the temperature of the reactor vessel 12. Until heated to this temperature, in the crystal manufacturing apparatus 1 of this Example, gas in the inner vessel 11 was heated so that the whole pressure was 8 MPa.

Next, the valve 15 was opened so that the pressure of nitrogen gas was 8 MPa, and the pressure equilibrium state was established between the inside of the inner vessel 11 and the inside of the nitrogen supplying pipe 17.

After a crystal of gallium nitride was grown while maintaining the reactor vessel 12 for 500 hours under this state, the heater 13 was controlled to cool the inner vessel 11 to a room temperature (around 20 degrees Celsius). After decreasing the gas pressure in the inner vessel 11, the inner vessel 11 was opened. In the reactor vessel 12, many gallium nitride crystals 25 were formed. Grown gallium nitride crystals 25 were colorless and transparent, had the crystal diameter "d" of about 100 to 1500 μm, had the length "L" of about 10 to 40 mm, and had the ratio L/d of the length "L" to the crystal diameter d was about 20 to 300. The gallium nitride crystals 25 were grown generally parallel to the c-axis, and had the m-planes (see FIG. 3) formed on the side surfaces of each crystal.

The gallium nitride crystal 25 manufactured in this Example was subject to various measurements. The measurement results were shown below.

<Photoluminescence (PL) Measurement Result>

Photoluminescence (PL) was measured at a room temperature (25 degrees Celsius) with respect to the gallium nitride crystal manufactured in the Example. Photoluminescence was measured by using LabRAM HR-800 fabricated by HORIBA, Ltd. As an exciting light source, helium-cadmium (He—Cd) laser having a wavelength of 325 nm was used. Photoluminescence was measured with respect to the first region 25a which was an inner region of the seed crystal 25 and with respect to the second region 25b which was an outer region of the seed crystal 25, respectively.

FIG. 5 shows one example of measurement result of emission spectra of PL with respect to the first region 25a and the second region 25b. The horizontal axis means wavelength (nm), and the vertical axis means emission intensity.

As shown by a solid line in FIG. 5, as for the first region 25a, a broad emission (the second peak) having a peak around 600 no was observed in a range of 500 nm to 800 nm, while only a very weak intensity of emission was observed for an emission (the first peak) from a vicinity of band edge (365 nm) of gallium nitride.

On the other hand, as shown by a dotted line in FIG. 5, as for the second region 25b, a strong peak intensity of emission (the first peak) from the vicinity of band edge (365 nm) of gallium nitride was observed, while only a very weak intensity of emission was observed for a broad emission (the second peak) in a range of 500 nm to 800 nm.

Thus, with respect to the seed crystal 25 manufactured by the Example, it was confirmed that the peak intensity of the first peak was smaller than the peak intensity of the second peak in the first region 25a contained at inner side of the seed crystal 25. It was also confirmed that the peak intensity of the first peak was greater than the peak intensity of the second peak in the second region 25b located at outer side of the seed crystal 25.

Figure 23:
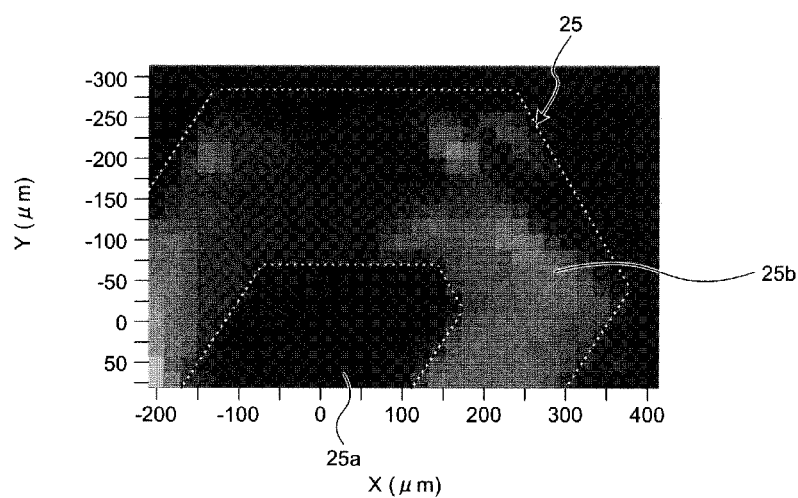
FIG. 23 is a mapping image of photoluminescence with respect to a spectral intensity of 360 nm to 370 nm.
Figure 24:
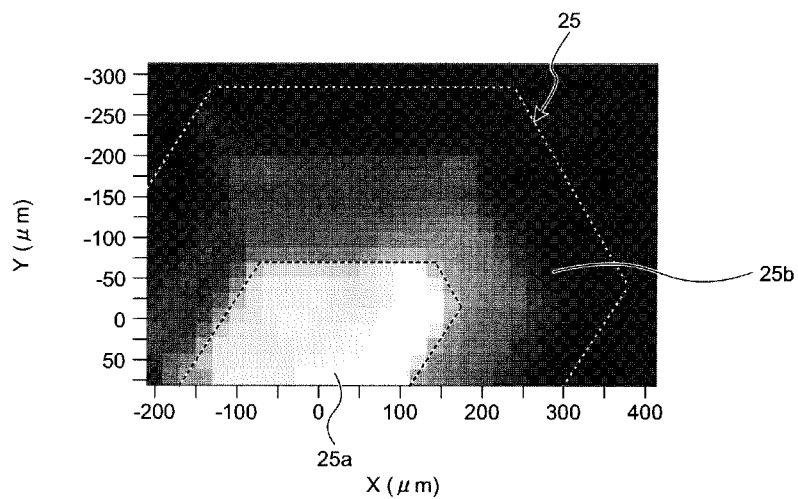
FIG. 24 is a mapping image of photoluminescence with respect to a spectral intensity of 500 nm to 800 nm.

Next, with reference to FIG. 23 and FIG. 24, an explanation will be made on emission intensity distributions of photoluminescence. FIG. 23 and FIG. 24 show one example of photoluminescence measurement result which was measured as for the c-plane of the gallium nitride crystal 25 manufactured by the Example, showing spectral intensity with different wavelength band at the same measurement point on the c-plane cross section.

FIG. 23 shows a mapping image of the spectral intensity in a range of 360 nm to 370 nm of photoluminescence. Darker color indicates stronger spectral intensity in a range of 360 nm to 370 nm.

FIG. 24 shows a mapping image of the spectral intensity in a range of 500 nm to 800 nm of photoluminescence. Darker color indicates stronger spectral intensity in a range of 500 nm to 800 nm.

Therefore, according to the mapping result of FIG. 23 and FIG. 24, it was confirmed that the gallium, nitride crystal 25 had the first region 25a at inner side thereof and the second region 25b at outer side thereof.

Also, as a result of PL measurement as for the c-plane cross section of the seed crystal 25 manufactured by the Example, it was confirmed that the second region 25b surrounds a whole outer periphery of the first region 25a in some gallium nitride crystals 25, as shown in FIG. 4. In other gallium nitride crystals 25, it was confirmed that the second region 25b surrounds a part of the outer periphery of the first region 25a, as shown in FIG. 3. Thus, it was confirmed that the second region 25b surrounds at least a part of the outer periphery of the first region 25a, in the c-plane cross section of the gallium nitride crystal 25 manufactured by the Example.

<Boron Density Measurement>

Boron density in the crystal was measured by using a secondary ion mass spectrometer (SIMS) with respect to the gallium nitride crystal 25 manufactured by the Example. As SIMS, IMS 7f (model name) fabricated by CAMECA was used. As primary ion beam, $Cs^+$ ion was used. The primary ion accelerating voltage was 15 kV, and the detection area was 30 μmϕ. In this measurement, the boron density was measured at a plurality of points with respect to the inner region (i.e. the first region 25a) and with respect to the outer region (i.e. the second region 25b) in the c-plane cross section of the gallium nitride crystal 25, respectively, as shown in FIG. 4.

Although there were some variations depending on the measurement points, the boron density in the first region 25a was approximately $5 \times 10^{18}$ $cm^{-3}$ to $3 \times 10^{19}$ $cm^{-3}$, and the boron density in the second region 25b was approximately $1 \times 10^{16}$ $cm^{-3}$ to $8 \times 10$ $cm^{-3}$.

Thus, with respect to the gallium nitride crystal 25 manufactured by the Example, it was confirmed that the boron density in the second region 25b at outer side was lower than that of the first region 25a at inner side in the c-plane cross section. Thus, it was confirmed that there was a double layered structure made of the first region 25a and the second region 25b.

<Example of Forming Bulk Crystal from Seed Crystal Via SG>

Next, an explanation will be made on Example of forming the group 13 nitride crystal 80 by SG (Seed Growth) from the seed crystal 25, according to the crystal manufacturing method mentioned in [3].

Example 1

In this Example, a group 13 nitride crystals 80 having a structure as shown in FIG. 10A was formed by growing the seed crystal 25 in the crystal manufacturing apparatus 2 as illustrated in FIG. 7.

As the seed crystal 25, the gallium nitride crystal having a width of 1 mm and a length of 40 mm was used. The seed crystal 25 used in this Example had a structure in which the second region 25b surrounds an entire periphery of the first region 25a, as shown in FIG. 4, in at least a part of the c-planes. In a c-plane cross section of the seed crystal 25, it was confirmed that the thickness "t" (the thickness in the m-axis direction, see FIG. 2A) of the second region 25b was at least 10 μm or more.

Firstly, the inner vessel 51 was separated from the crystal manufacturing apparatus 2 at the valve 61 portion, and placed into the glove box under Ar atmosphere. Next, the seed crystal 25 was placed in the reactor vessel 52 made of alumina and having an inner diameter of 140 mm and a depth of 100 mm. The seed crystal 25 was retained by inserting the crystal 25 into a hole having a depth of 4 mm made at the bottom of the reactor vessel 52. The seed crystal 25 was retained so that Ga surface faced upward, as shown in FIG. 8.

Next, sodium (Na) was heated to be liquid and then put into the reactor vessel 52. After the sodium became solidified, gallium was input. In this Example, a mol ratio of gallium to sodium was 0.25:0.75.

Then, in the glove box, the reactor vessel 52 was placed into the inner vessel 51 under a high purity Ar gas atmosphere. Then, the valve 61 was closed to seal the inner vessel 51 filled with Ar gas, and shut out the inner space of the reactor vessel 52 from the outside atmosphere. Next, the inner vessel 51 was taken out from the glove box and then assembled into the crystal manufacturing apparatus 2. Specifically, the inner vessel 51 was installed at a predetermined place with respect to the heater 53, and connected to the gas supplying pipe 54 at the valve 61 portion.

Next, after argon gas was purged from the inner vessel 51, nitrogen gas was introduced from the nitrogen supplying pipe 57. The nitrogen gas was subjected to the pressure control by the pressure regulator 56, and the valve 55 was opened, so that the nitrogen pressure in the inner vessel 51 was 1.2 MPa. Then, the valve 55 was closed and the pressure regulator 56 was set at 3.2 MPa.

Next, the heater 53 was turned on to heat the reactor vessel 52 to a crystal growth temperature. In this Example, the crystal growth temperature was 870 degrees Celsius. Then, similarly to the above Example, the valve 55 was opened so that the nitrogen gas pressure became 3 MPa. Gallium nitride crystal 27 was formed by maintaining the reactor vessel 52 for 1300 hours under this state.

As a result, in the reactor vessel 52, a gallium nitride crystal 80a (single crystal) having a larger crystal diameter increased in a direction orthogonal to the c-axis was formed from the gallium nitride crystal 25 as the seed crystal. The gallium nitride crystal 80a was generally colorless and transparent, and had the crystal diameter "d" of 51 mm, the length "L" in the c-axis direction of 54 mm including the seed crystal part 25 which were inserted into the hole at the bottom of the reactor vessel 52. The gallium nitride crystal 80a had a shape in which the upper part was a six-sided pyramid-like shape and the lower part was a hexagonal column-like shape, as shown in FIG. 10A. At the upper part of the crystal, the outer periphery mainly made of {10-11} planes was formed. At the lower part of the crystal, the outer periphery mainly made of m-planes ({10-10} planes) was formed.

Thus, in Example 1 in which the seed crystal 25 was installed in the reactor vessel 52 so that Ga surface faced upward as shown in FIG. 8, it was confirmed that at the upper part of the crystal, the outer periphery mainly made of {10-10} plane and the outer periphery mainly made of {10-11} plane were formed, and at the bottom surface of the crystal, the outer periphery mainly made of {001} plane was formed in the obtained gallium nitride crystal 80*a*.

Example 2

A gallium nitride crystal 80*e* was formed under the same conditions of Example 1 except that the seed crystal 25 was installed in the reactor vessel 52 so that N surface side faced upward, as shown in FIG. 9. The gallium nitride crystal 25 used as the seed crystal in this Example had a diameter of 1.2 mm and a length of about 50 mm.

As a result, in the reactor vessel 52, a gallium nitride crystal 80*e* having a larger crystal diameter increased in a direction orthogonal to the c-axis was formed from the gallium nitride crystal 25 as the seed crystal. The gallium nitride crystal 80*e* was generally colorless and transparent, and had the crystal diameter "d" of 56 mm, the length "L" in the c-axis direction of 52 mm including the seed crystal part 25 which were inserted into the hole at the bottom of the reactor vessel 52. The gallium nitride crystal 80*e* had a shape in which the top surface mainly made of c-plane was formed at the top part of the crystal, as shown in FIG. 11B. Specifically, the gallium nitride crystal 80*e* had a shape in which the outer peripheries mainly made of {0001} planes were made at the top part and the bottom part of the crystal, and the outer periphery mainly made of {10-10} plane and the outer periphery mainly made of {10-11} plane were formed at the side surfaces of the crystal, as shown in FIG. 11B.

Thus, in Example 2 in which the seed crystal 25 was installed in the reactor vessel 52 so that N surface faced upward as shown in FIG. 9, it was confirmed that the outer peripheries mainly made of {0001} planes were formed at the top surface and the bottom surface of the crystal, and the outer periphery mainly made of {10-10} plane and the outer periphery mainly made of {10-11} plane were formed at the side surfaces of the crystal, in the obtained gallium nitride crystal 80*e*.

Example 3

Examples of Fabricating Crystal Substrate

A gallium nitride crystal substrate 100 (see FIG. 18A) having an outer diameter (φ) of 2 inches, a thickness of 400 μm, and the c-plane as main face was fabricated by grinding the outline of the gallium nitride crystal 80 manufactured by Example 1, slicing the grinded crystal parallel to the c-plane, polishing the sliced crystal surface, and treating surface(s) of the polished crystal.

<Dislocation Density Measurement>

The dislocation density was obtained in such a manner that the c-plane surface of the crystal substrate 100 was etched with acid (mixed acid of phosphoric acid and sulfuric acid, 230 degrees Celsius) to obtain the etch pit density. The obtained etch pit density was evaluated as the dislocation density. As a result, the dislocation density of the seed crystal 25 was $6 \times 10^7$ cm$^{-2}$ or less. The dislocation density of the gallium nitride crystal 27 grown from the seed crystal 25 was in the order of $10^2$ cm$^{-2}$. According to the microscopic observation, it was confirmed that the crystal substrate 100 had no crack.

<X-ray Measurement>

Half-value width (full width at half maximum, FWHM) of X-ray rocking curve was measured with respect to the c-plane crystal substrate 100. As an X-ray diffractometer, an X-ray diffractometer X' Pert PRO MRD fabricated by PANalytical was used. As a result, FWHM in the c-plane was 30 to 60 arcsec. It was confirmed that an entire surface of the c-plane was a high quality gallium nitride crystal substrate.

Example 4

Examples of Fabricating Crystal Substrate

A crystal substrate 100 (see FIG. 18) having a height of 40 mm, a side width of 40 mm, a thickness of 400 μm, and the a-plane as main face was fabricated by grinding the outline of the gallium nitride crystal 80 manufactured by Example 2, slicing the grinded crystal parallel to the a-plane, polishing the sliced crystal surface, and treating surface(s) of the polished crystal. Furthermore, a crystal substrate 100 having m-plane as main face, and a crystal substrate 100 having {10-11} plane as main face were fabricated.

Main faces of the a-plane crystal substrate 100, the m-plane crystal substrate 100, and the {10-11} plane crystal substrate 100 were etched with acid solution (mixed acid of phosphoric acid and sulfuric acid, 230 degrees Celsius) to obtain the etch pit densities. The obtained etch pit densities were evaluated as the dislocation densities. As a result, the dislocation densities were in the order of $10^6$ cm$^{-2}$ to $10^7$ cm$^{-2}$, in any of the a-plane crystal substrate 100, the m-plane crystal substrate 100, and the {10-11} plane crystal substrate 100. Therefore, it was confirmed that these substrates had the dislocation densities greater than that of the c-plane crystal substrate 100 mentioned in Example 4. According to the microscopic observation, it was confirmed that the crystal substrate 100 had no crack.

Thus, according to Examples 3 and 4, it was confirmed that the crystal substrate with lower dislocation density can be obtained by processing the crystal so as to include c-plane as the main face.

As explained above, according to Examples, it was confirmed that the c-plane crystal substrate can be obtained with lower dislocation density and no crack.

According to the invention, it is possible to reduce the dislocation extending in the c-axis direction, since the invention includes a process of forming the m-plane ({10-10} plane). Therefore, by growing the group 13 nitride crystal from the gallium nitride crystal having such a m-plane as the seed crystal, the high quality group 13 nitride crystal can be manufactured with less dislocation density, and the high quality crystal substrate can be fabricated by using the group 13 nitride crystal.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A method of manufacturing a gallium nitride, comprising:
   a crystal growth process to foam a gallium nitride crystal by growing the gallium nitride having a hexagonal crystal structure from a seed crystal which is a gallium nitride crystal having a hexagonal crystal structure in which a length "L" in a c-axis direction is 37.4 mm or more, and a ratio L/d of the length "L" to a crystal diameter "d" in a c-plane is larger than 0.813, wherein
   the seed crystal includes boron, and density of boron in the seed crystal is $4 \times 10^{18}$ atms/cm$^3$, and
   the crystal growth process includes a process of forming an outer periphery containing a {10-10} plane and an outer periphery containing a {10-11} plane at side surfaces of the gallium nitride, and forming an outer periphery containing a {0001} plane at a bottom surface of the gallium nitride.

2. The method according to claim 1, wherein in the crystal growth process, a growth rate of forming the gallium nitride in a <10-10> direction is faster than a growth rate of forming the gallium nitride in a <10-11> direction.

3. The method according to any of claim 1, comprising:
a seed crystal installing process to install the seed crystal which is a gallium nitride crystal having a hexagonal crystal structure in which a length "L" in a c-axis direction is 37.4 mm or more, and a ratio L/d of the length "L" to a crystal diameter "d" in a c-plane is larger than 0.813 into a reactor vessel;
a putting process to put an alkali metal and a material containing at least a group 13 element into the reactor vessel;
a molten mixture forming process to melt the alkali metal and the material containing at least a group 13 element to form a molten mixture;
a nitrogen dissolving process to bring a gas containing nitrogen into contact with the molten mixture to dissolve the nitrogen from the gas into the molten mixture; and
a crystal growth process to obtain the gallium nitride by growing the gallium nitride from the seed crystal, with the nitrogen and the group 13 element in the molten mixture, wherein
in the seed crystal installation process, the gallium nitride crystal is installed at a bottom of the reactor vessel so that Ga surface faces upward.

4. A method of manufacturing a gallium nitride, comprising:
a crystal growth process to form the gallium nitride by growing gallium nitride having a hexagonal crystal structure from a seed crystal which is a gallium nitride crystal having a hexagonal crystal structure in which a length "L" in a c-axis direction is 37.4 mm or more, and a ratio L/d of the length "L" to a crystal diameter "d" in a c-plane is larger than 0.813, wherein
the seed crystal includes boron, and density of boron in the seed crystal is $4 \times 10^{18}$ atms/cm$^3$, and
the crystal growth process includes a process of forming outer peripheries containing a {0001} plane at a top surface and a bottom surface of the gallium nitride, and forming an outer periphery containing a {10-10} plane and an outer periphery containing a {10-11} plane at side surfaces of the gallium nitride.

5. The method according to claim 4, wherein
in the crystal growth process, a growth rate of forming the gallium nitride in a <10-10> direction is faster than a growth rate of forming the gallium nitride in a <10-11> direction.

6. The method according to claim 4, wherein
in the crystal growth process, a growth rate of forming the gallium nitride in a <10-11> direction is faster than a growth rate of forming the gallium nitride in a <0001> direction.

7. The method according to claim 4, comprising:
a seed crystal installing process to install the seed crystal which is a gallium nitride crystal having a hexagonal crystal structure in which a length "L" in a c-axis direction is 37.4 mm or more, and a ratio L/d of the length "L" to a crystal diameter "d" in a c-plane is larger than 0.813 into a reactor vessel;
a putting process to put an alkali metal and a material containing at least a group 13 element into the reactor vessel;
a molten mixture forming process to melt the alkali metal and the material containing at least a group 13 element to form a molten mixture;
a nitrogen dissolving process to bring a gas containing nitrogen into contact with the molten mixture to dissolve the nitrogen from the gas into the molten mixture; and
a crystal growth process to obtain the gallium nitride by growing the gallium nitride from the seed crystal, with the nitrogen and the group 13 element in the molten mixture, wherein
in the seed crystal installation process, the gallium nitride crystal is installed at a bottom of the reactor vessel so that Ga surface faces upward.

8. The method according to claim 4, comprising:
a seed crystal installing process to install the seed crystal which is a gallium nitride crystal having a hexagonal crystal structure in which a length "L" in a c-axis direction is 37.4 mm or more, and a ratio L/d of the length "L" to a crystal diameter "d" in a c-plane is larger than 0.813 into a reactor vessel;
a putting process to put an alkali metal and a material containing at least a group 13 element into the reactor vessel;
a molten mixture forming process to melt the alkali metal and the material containing at least a group 13 element to form a molten mixture;
a nitrogen dissolving process to bring a gas containing nitrogen into contact with the molten mixture to dissolve the nitrogen from the gas into the molten mixture; and
a crystal growth process to obtain the gallium nitride by growing the gallium nitride from the seed crystal, with the nitrogen and the group 13 element in the molten mixture, wherein
in the seed crystal installation process, the gallium nitride crystal is installed at a bottom of the reactor vessel so that N surface faces upward.

* * * * *